United States Patent
Sakurai

(10) Patent No.: US 9,570,508 B2
(45) Date of Patent: Feb. 14, 2017

(54) PHOTOELECTRIC CONVERSION DEVICE AND OPERATION METHOD FOR PHOTOELECTRIC CONVERSION DEVICE

(71) Applicant: CANON KABUSHIKI KAISHA, Tokyo (JP)

(72) Inventor: Katsuhito Sakurai, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 612 days.

(21) Appl. No.: 13/713,488

(22) Filed: Dec. 13, 2012

(65) Prior Publication Data

US 2013/0153749 A1 Jun. 20, 2013

(30) Foreign Application Priority Data

Dec. 15, 2011 (JP) ................................ 2011-274891

(51) Int. Cl.
| | |
|---|---|
| *H01L 27/148* | (2006.01) |
| *H04N 5/378* | (2011.01) |
| *H04N 5/3745* | (2011.01) |
| *H01L 27/146* | (2006.01) |

(52) U.S. Cl.
CPC ... *H01L 27/14806* (2013.01); *H01L 27/14612* (2013.01); *H04N 5/378* (2013.01); *H04N 5/3745* (2013.01); *H01L 27/1464* (2013.01); *H01L 27/14605* (2013.01)

(58) Field of Classification Search
CPC . H01L 27/144; H01L 27/14806; H04N 5/335; H03K 3/86; H02J 4/00
USPC ............... 250/208.1, 214 R, 214 A, 214 LA, 214 SW,250/214 C; 348/294–312
See application file for complete search history.

(56) References Cited

U.S. PATENT DOCUMENTS

| | | | |
|---|---|---|---|
| 6,339,215 B1 | 1/2002 | Yonemoto | |
| 6,518,910 B2 | 2/2003 | Sakuragi | |
| 7,068,312 B2 | 6/2006 | Kakumoto | |
| 7,091,978 B2 | 8/2006 | Yoshimura | |
| 7,542,086 B2 | 6/2009 | Hagihara | |
| 7,567,280 B2 * | 7/2009 | Muramatsu | 348/294 |
| 7,796,174 B1 * | 9/2010 | Harwit | 348/311 |

(Continued)

FOREIGN PATENT DOCUMENTS

| | | |
|---|---|---|
| JP | 2001-157114 A | 6/2001 |
| JP | 2003-259228 A | 9/2003 |

*Primary Examiner* — Georgia Y Epps
*Assistant Examiner* — Don Williams
(74) *Attorney, Agent, or Firm* — Canon USA, Inc. IP Division

(57) ABSTRACT

A photoelectric conversion unit generates an amount of charges. A differential amplifier has first and second input transistors and is configured to output a current signal based on the amount of charges. A reset voltage providing unit is configured to provide a reset voltage for input nodes of the first and second input transistors. A transfer transistor is electrically connected to, and configured to transfer a charge to, the input node of the first input transistor. A reset transistor is electrically connected to one of the input nodes, and configured to control an electrical connection between the reset voltage providing unit and the input node connected to the reset transistor. A connection transistor has first and second nodes and is configured to control an electrical connection between the input nodes. The first and second nodes are connected to the input nodes of the first and second input transistors, respectively.

15 Claims, 16 Drawing Sheets

(56) References Cited

U.S. PATENT DOCUMENTS

2003/0137594 A1\* 7/2003 Koizumi .......... H01L 27/14609
348/308

\* cited by examiner

PHOTOELECTRIC CONVERSION DEVICE AND OPERATION METHOD FOR PHOTOELECTRIC CONVERSION DEVICE

BACKGROUND OF THE INVENTION

Field of the Invention

The disclosure relates to a photoelectric conversion device and an operation method for a photoelectric conversion device.

Description of the Related Art

Japanese Patent Laid-Open No. 2001-157114 describes an image sensor including a plurality of pixels, each of which includes a photodiode and a differential output unit. The differential output unit converts a difference of voltages stored in two storing units into a current signal, and outputs the current signal.

SUMMARY OF THE INVENTION

According to one or more embodiments a photoelectric conversion unit generates an amount of charges. A differential amplifier is configured to output a current signal based on the amount of charges generated by the photoelectric conversion unit. The differential amplifier includes a first input transistor and a second input transistor forming a differential pair. A transfer transistor is electrically connected to an input node of the first input transistor, and configured to transfer the charge generated by the photoelectric conversion unit to the input node of the first input transistor. A reset voltage providing unit is configured to provide a reset voltage for the input node of the first input transistor and an input node of the second input transistor. A reset transistor is electrically connected to either one of the input node of the first input transistor or the input node of the second input transistor, and configured to control an electrical connection between the reset voltage providing unit and the input node connected to the reset transistor. A connection transistor is configured to control an electrical connection between the input node of the first input transistor and the input node of the second input transistor. A first node of the connection transistor is connected to the input node of the first input transistor, and a second node of the connection transistor is connected to the input node of the second input transistor.

According to one or more embodiments, a method for operating a photoelectric conversion device is provided. The device according to the present embodiments includes a photoelectric conversion unit. The device according to the embodiments includes a differential amplifier configured to output a current signal based on an amount of charges generated by the photoelectric conversion unit. The differential amplifier includes a first input transistor and a second input transistor forming a differential pair. The device according to the embodiments includes a transfer transistor electrically connected to an input node of the first input transistor. The transfer transistor is configured to transfer a charge generated by the photoelectric conversion unit to the input node of the first input transistor. The device according to the embodiments includes a reset voltage providing unit configured to provide a reset voltage for the input node of the first input transistor and an input node of the second input transistor. The device according to the embodiments includes a reset transistor electrically connected to either one of the input node of the first input transistor or the input node of the second input transistor. The reset transistor is configured to control an electrical connection between the reset voltage providing unit and the input node connected to the reset transistor. The device according to the embodiments includes a connection transistor configured to control an electrical connection between the input node of the first input transistor and the input node of the second input transistor. A first node of the connection transistor is connected to the input node of the first input transistor, and a second node of the connection transistor is connected to the input node of the second input transistor. The method according to the embodiments comprises a step of turning on both of the reset transistor and the connection transistor. The method according to the embodiments comprises a step of, thereafter, tuning off the reset transistor. The method according to the embodiments comprises a step of, thereafter, turning off the connection transistor.

Further features of the disclosure will become apparent from the following description of exemplary embodiments with reference to the attached drawings.

DESCRIPTION OF THE EMBODIMENTS

Figure 1:
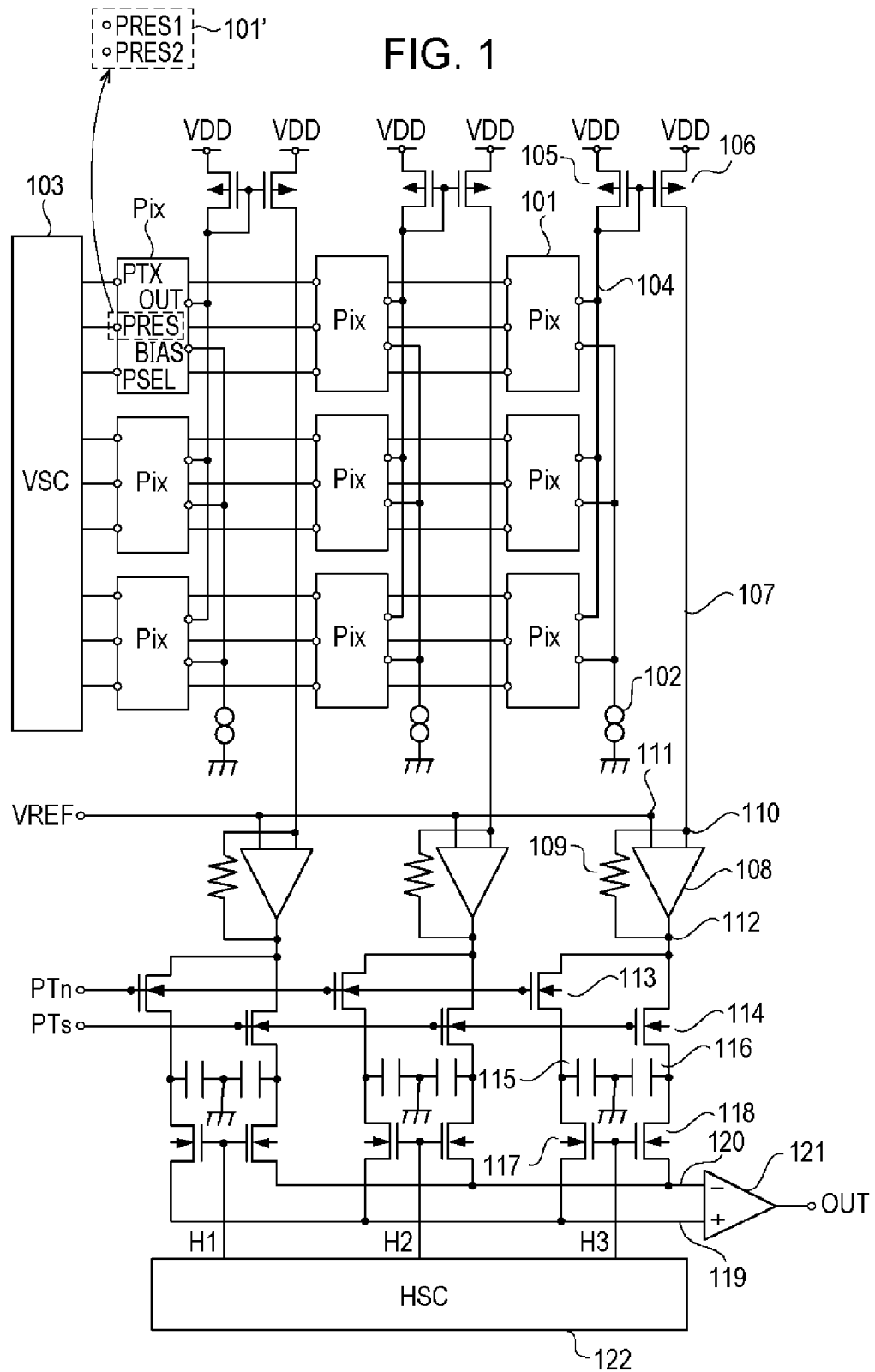
FIG. 1 illustrates an equivalent circuit of a first exemplary embodiment.

A photoelectric conversion device according to one or more embodiments includes a pixel. The pixel includes a photoelectric conversion unit and a differential amplifier. The photoelectric conversion unit converts incident light into a charge. The photoelectric conversion unit may be, for example, a photodiode. The differential amplifier includes a first input transistor and a second input transistor which form a differential pair. The differential amplifier outputs a current signal according to the difference between the voltages of the two input nodes.

A transfer transistor is provided, which transfers charges generated at the photoelectric conversion unit into either one of the two input nodes of the differential amplifier. In detail, the transfer transistor is electrically connected to the input node of either one of the first and second input transistors. In case the input transistor is a MOS (Metal Oxide Semiconductor) transistor, the gate may be the input node.

In one or more embodiments, an amplification unit for converting the charges of the photoelectric conversion unit into a voltage signal to be input to the differential amplifier may be omitted. In one or more embodiments, a voltage-signal storing unit for storing the voltage signal to be input to the differential amplifier may be omitted. Accordingly, sensitivity may be improved by reduction of the number of elements included in the pixel, in one or more embodiments.

A connection transistor is provided, which controls an electrical connection between the two input nodes of the differential amplifier. The connection transistor may be, for example, a MOS transistor. The source and the drain of the MOS transistor correspond to a first node and a second node of the connection transistor. One of the source and the drain is electrically connected to the input node of the first input transistor, and the other is electrically connected to the input node of the second input transistor. The connection transistor is controlled to be on or off by a voltage provided for the gate of the connection transistor. By turning on or off, the connection transistor may control the electrical connection between the two input nodes.

In one or more embodiments, the connection transistor may reduce or cancel reset noise, which is generated when the input node of the differential amplifier is reset.

Before the charges are transferred to the input node of the differential amplifier, the input node may be reset. A reset transistor for providing the input node with a reset voltage from a reset voltage providing unit is electrically connected to the input node. When the reset transistor connected to the input node is turned off, thermal noise, such as kTC noise, may be generated.

When the amount of noise of one of the input nodes is different from that of the other due to the randomness thereof, the two input nodes may be reset into different voltages, which cause the reset noise. In the case where the reset voltages are provided for the two input nodes through different electrical paths, the amount of noise of one of the two input nodes may be different from that of the other.

In one or more embodiments, when the connection transistor is turned on, the voltages of the two input nodes may be substantially equal to each other. Hence, when the connection transistor turns off, generated noise may be equally divided and transferred into the two input nodes. That is, by turning off the connection transistor being in the on state, the difference of the amount of the noise between the two input nodes may be reduced or cancelled. As a result, the reset noise may be reduced.

In one or more embodiments, one of the two input nodes of the differential amplifier is provided with the reset voltage through the reset transistor. The other of the two input nodes is provided with the reset voltage through the reset transistor and the connection transistor. Each of the two input nodes may be in an electrically floating state.

In one or more embodiments, the photoelectric conversion device may be used for imaging. For imaging, the photoelectric conversion device includes a plurality of the pixels. Since the reset noise is random noise, it is simpler to reduce or cancel the reset noise at the pixel than to process the obtained images. The pixel may be defined as a repeated unit, or a periodical unit, including the photoelectric conversion unit and the corresponding transistors.

In the following detailed description, for purposes of explanation, numerous specific details are set forth in order to provide a thorough understanding of the disclosed embodiments. These embodiments may have the above mentioned features. It will be apparent, however, that one or more embodiments may be practiced without these specific details. In other instances, well-known structures and devices are schematically shown in order to simplify the drawings. One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

In the following embodiments, an electron is used as a signal charge. In other embodiments, a hole may be used as a signal charge, and the conductivity type of the elements may be inverted.

First Exemplary Embodiment

FIG. 1 illustrates an equivalent circuit of a photoelectric conversion device according to one or more embodiments. The photoelectric conversion device includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion outputs the voltage signal to the outside of the device.

The charges generated in the photoelectric conversion unit is transferred either one of the two input nodes of the differential amplifier included in the pixel by the transfer transistor. The pixel includes the connection transistor which controls an electrical connection between the two input nodes of the differential amplifier.

Each part of the photoelectric conversion device of the present embodiment will be described in detail. The plurality of pixels 101 are arranged so as to form a pixel array including three rows and three columns. The number of the pixels 101 is not limited. For example, the plurality of pixels 101 are arranged so as to form a pixel array including more than 1000 rows and more than 1500 columns. In another case, the plurality of pixels 101 may be arranged in a line so as to form a line sensor.

Signals from the pixels 101 included in a single pixel column may be processed in common circuitry. In the following description, exemplary one of the pixel columns will be explained. The other pixel columns may have the same structure, configuration and/or circuitry as the exemplary one.

The pixel 101 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 101 may be a signal source configured to output a current signal. The pixel 101 includes OUT node, via which the current signal from the pixel 101 is output. The pixel 101 may further include a BIAS node, via which a bias current is provided from a bias current source, and a plurality of nodes (PTX node, PRES node and PSEL node), via which drive signals are provided. The detailed structure of the pixel 101 will be described later.

The BIAS node of the pixel 101 is electrically connected to the bias current source 102. A plurality of the pixel 101 may be electrically connected to the common bias current source 102. For example, the pixels 101 included in a single pixel column are electrically connected to the common bias current source 102. In another case, a bias current source 102 may be provided for each of the pixels 101 in the pixel column.

The PTX node, the PRES node and the PSEL node are electrically connected to the vertical scanning circuit 103. The vertical scanning circuit 103 may provide a common drive signal for the pixels 101 included in a single pixel row. Further, the vertical scanning circuit 103 may provide the pixels included in different rows from each other with independent drive signals. According to the drive signals the vertical scanning circuit provides, the signals are read out from the pixels 101 on the pixel row basis. The PRES node is shown to be enclosed in a dotted enclosure to indicate that other arrangement is possible. For example, as shown in a dotted enclosure 101', there may be two PRES nodes: a PRES1 node and a PRES2 node corresponding to two resent control signals. This notation is also used in FIGS. 9 and 10.

The OUT node of the pixel 101 is electrically connected to a first output line 104. The OUT nodes of a plurality of the pixels 101 may be electrically connected to the common first output line 104. For example, the OUT nodes of the pixels 101 included in a single pixel column are electrically connected to the common first output line 104. Thus, the current signals from the plurality of the pixels 101 may be output to the first output line 104.

The first output line 104 is electrically connected to the current mirror circuit. An output node of the current mirror circuit is electrically connected to a second output line 107. The current mirror circuit includes an input-side transistor 105 and an output-side transistor 106. The input-side and output-side transistors 105, 106 are P-type channel MOS (Metal Oxide Semiconductor) transistors. The gate and the drain of the input-side transistor 105 are shorted. The source of the input-side transistor 105 is electrically connected to a power source line. The power source line may provide the source of the input-side transistor 105 with a power source voltage VDD. The gate of the output-side transistor 106 is electrically connected to the gate of the input-side transistor 105. The source of the output-side transistor 106 is electrically connected to a power source line. The power source line may provide the source of the output-side transistor 106 with a power source voltage VDD. The first output line 104 is electrically connected to the drain of the input-side transistor 105 and the gates which are shorted to the drain of the input-side transistor 105. The drain of the output-side transistor 106 is electrically connected to the second output line 107.

In the current mirror circuit, a current running through the input-side transistor 105 may be mirrored in the output-side transistor 106. In other words, the current mirror circuit may output a current signal (a mirrored current signal) corresponding to the current signal at the first output line 104 into the second output line 107. The current mirror circuit may output the mirror current signal which is amplified or attenuated with respected to the current signal at the first output line 104. The amplification (or attenuation) factor may be determined according to a ratio of the sizes of the input and output-side transistors 105, 106. For example, in a case of the input and output-side transistors 105, 106 having the substantially same channel length, the amplification (or attenuation) factor may be the ratio of the channel widths.

The second output line 107 is electrically connected to the current to voltage convertor. The current to voltage convertor includes an operational amplifier 108 and a conversion resistor 109. The second output line 107 is electrically connected a first input node 110 of the operational amplifier 108. The second input node 111 of the operational amplifier 108 is electrically connected to a reference voltage line. The reference voltage line may provide a reference voltage VREF for the second input node 111 of the operational amplifier. The first input node 110, which is electrically connected to the second output line 107, is electrically connected to an output node 112 of the operational amplifier 108 via the conversion resistor 109. One node of the conversion resistor 109 is connected to the second output line 107 and the first input node 110 of the operational amplifier 108. And, the other node of the conversion resistor 109 is connected to the output node 112 of the operational amplifier.

The operational amplifier may work such that its two input nodes 110 and 111 have the same voltage. Since the reference voltage VREF is provided for the second input node 111, the voltage of the first input node 110 may be set in the reference voltage VREF. That is, the voltage of the one node of the conversion resistor 109 may be the reference voltage VREF. Accordingly, the voltage of the other node of the conversion resistor 109 may be determined by a voltage drop at the conversion resistor 109, which is give by its resistance and amplitude of a current running through the conversion resistor 109. Since the operational amplifier has a high input impedance, all or most of the current at the second output line 107 may flow into the conversion resistor 109. Hence, a voltage corresponding to the amplitude of the current at the second output line 107 may emerge at the output node 112 of the operational amplifier 108. As described above, the current signal from the second output line 107 may be converted into the voltage signal by the current to voltage convertor.

The conversion resistor 109 may have variable resistance. When the resistance of the conversion resistor 109 varies, a conversion gain in the conversion from the current signal to the voltage signal may vary. High resistance may result in a high gain. For a conversion of a current signal with small amplitude, the resistance of the conversion resistor 109 may be controlled to be high. A high gain may reduce an influence caused by a noise generated in the subsequent stages. For a conversion of a current signal with large amplitude, the resistance of the conversion resistor 109 may be controlled to be low. When a low gain is used, a wide dynamic range may be obtained.

Although the gain at the current to voltage conversion varies, the amplitude of the current running through the conversion resistance may be kept to be substantially constant. Hence, the power consumption may be kept substantially constant. Therefore, the power consumption may be reduced as compared with the case where the amplitude of the current signal is amplified for a high gain.

The output node 112 of the current to voltage convertor is electrically connected to the voltage signal storing portion. The voltage signal storing portion includes a first switch 113, a second switch 114, a CTN capacitor 115 and a CTS capacitor 116. The first switch 113 is provided in an electrical path between the output node 112 of the operational amplifier 108 and one node of the CTN capacitor 115. The gate of the first switch 113 is electrically connected to a PTN node. The other node of the CTN capacitor 115 may be provided with a ground voltage GND. The second switch 114 is provided in an electrical path between the output node 112 of the operational amplifier 108 and one node of the CTS capacitor 116. The gate of the second switch 114 is electrically connected to a PTS node. The other node of the CTS capacitor 116 may be provided with the ground voltage GND.

The PTN node may be provided with a drive signal for controlling the first switch 113 to be turned on or off. The PTS node may be provided with a drive signal for controlling the second switch 114 to be turned on or off. When the first switch 113 turns on, the voltage signal at the output node 112 of the operational amplifier 108 may be stored in the CTN capacitor 115. When the second switch 114 turns on, the voltage signal at the output node 112 of the operational amplifier 108 may be stored in the CTS capacitor 116. As described above, the voltage signal store portion may store the voltage signal, which has been converted from the current signal by the current to voltage convertor.

The voltage signal store portion is electrically connected to the output portion. The output portion includes a third switch 117, a fourth switch 118 and an output amplifier 121. The CTN capacitor 115 is electrically connected to the third output line 119 via the third switch 117. The CTS capacitor 116 is electrically connected to the fourth output line 120 via the fourth switch 118. The gates of the third and fourth switches are electrically connected to the horizontal scanning circuit 122. The third and fourth output lines 119 and 120 are electrically connected to the output amplifier 121. The output node of the output amplifier may be electrically connected to a subsequent signal processing unit (not shown).

The horizontal scanning circuit 122 may provide drive signals for controlling respectively the third and fourth switches 117 and 118 to be turned on or off. When the third switch 117 turns on, the voltage signal stored in the CTN capacitor 115 may be read out into the third output line 119 by capacitive division of charges. When the fourth switch 118 turns on, the voltage signal stored in the CTS capacitor 116 may be read out into the fourth output line 120 by capacitive division of charges. The output amplifier 121 may amplify the voltage signals at the third and fourth output lines 119 and 120 respectively. In another case, the output amplifier 121 may be a differential processing unit. For example, the output amplifier 121 may output a differential signal between the voltage signals at the third and fourth output lines 119 and 120. As above described, the output portion may output the voltage signal stored in the voltage signal storing portion.

Here, the capacitive division of charges will be described in detail. There provided are a first capacitor and a second capacitor which is connectable to the first capacitor via a switch. The capacitor may be a capacitive node. When the first capacitor is connected to the second capacitor, charges in the first capacitor may be divided into the first and second capacitor. In another aspect, the voltage of the first capacitor may be converted into a voltage corresponding to the composite capacitance of the first and second capacitors. For example, the voltage of the CTS capacitor 116 is converted into a voltage corresponding to the composite capacitance of the CTS capacitor 116 and the fourth output line 120.

As described above, the current signal from the pixel, which is a signal source, is converted into the voltage signal, and the converted voltage signal is output to the outside.

Hereinafter, an exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 2:
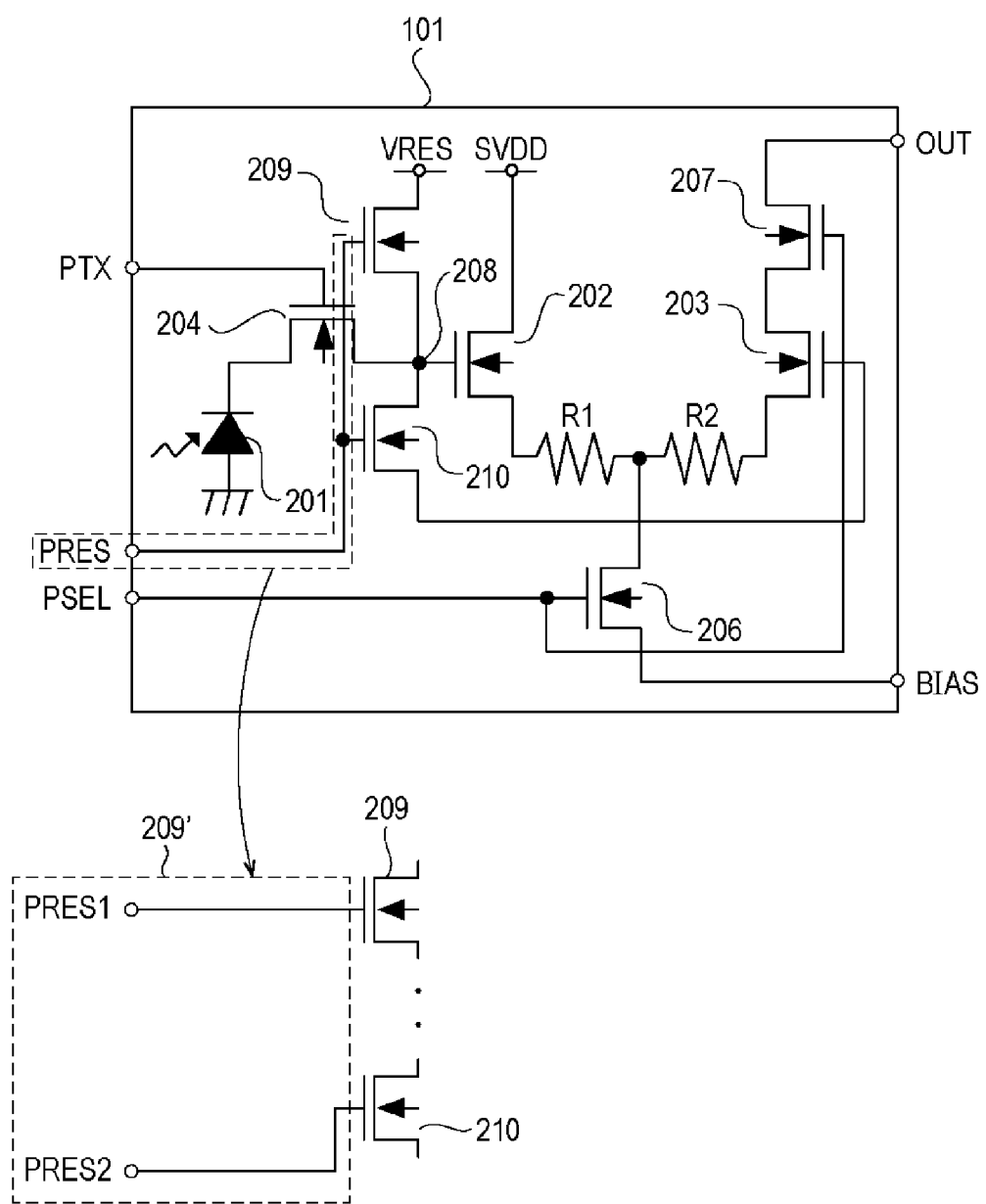
FIG. 2 illustrates an equivalent circuit of an exemplary pixel of an exemplary embodiment.

FIG. 2 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 209, a connection transistor 210, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which is provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a source of the connection transistor 210. The gate of the second input transistor 203 is a second input node of the differential amplifier. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 209. The reset transistor 209 controls an electrical connection between the node 208 and the reset voltage line. When the reset transistor 209 is turned on, the node 208 is provided with the reset voltage VRES. In other words, the reset transistor 209 may reset the voltage of the first input node of the differential amplifier.

The connection transistor 210 is provided in an electrical path between the gate of the first input transistor 202 (the node 208) and the gate of the second input transistor 203. In other words, one of the source and the drain of the connection transistor 210 is electrically connected to the gate of the first input transistor 202 and the other to the gate of the second input transistor 203. When the connection transistor is turned on, the gate of the first input transistor 202 and the gate of the second input transistor 203 are shorted to each other. When both of the reset transistor 209 and the connection transistor 210 are turned on, the reset voltage VRES may be provided for the gate of the second input transistor 203 via the reset transistor 209 and the connection transistor 210.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 209 and the gate of the connection transistor 210 are electrically connected to the PRES node. The gates of the first and second selection transistors 206, 207 are electrically connected to the PSEL node. The vertical scanning circuit 103 provides each gate of the transistors with a drive signal for controlling each of the transistors into on or off.

In FIG. 2, the gate of the reset transistor 209 and the gate of the connection transistor 210 are electrically connected to each other as shown in the dotted enclosure. In another case, the gate of the reset transistor 209 and the gate of the connection transistor 210 may be provided with independent drive signals PRES1 and PRES2 as shown in a dotted enclosure 209'. In this case the reset transistor 209 and the connection transistor 210 may be controlled independently from each other. For example, when the both of the reset transistor 209 and the connection transistor 210 are on, the reset transistor 209 is firstly turned off, thereafter the connection transistor 210 is turned off.

The first input transistor 202 and the second input transistor 203 may form a differential pair. That is, the sources of the two transistors 202 and 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are turned on, the differential amplifier may output the current signal via the OUT node.

In FIG. 2, a second reset transistor may be provided in an electrical path between the gate of the second input transistor 203 and the reset voltage line. In this case, accuracy of the current signal may be improved because the symmetrical characteristic of the differential amplifier may be improved.

Figure 3:
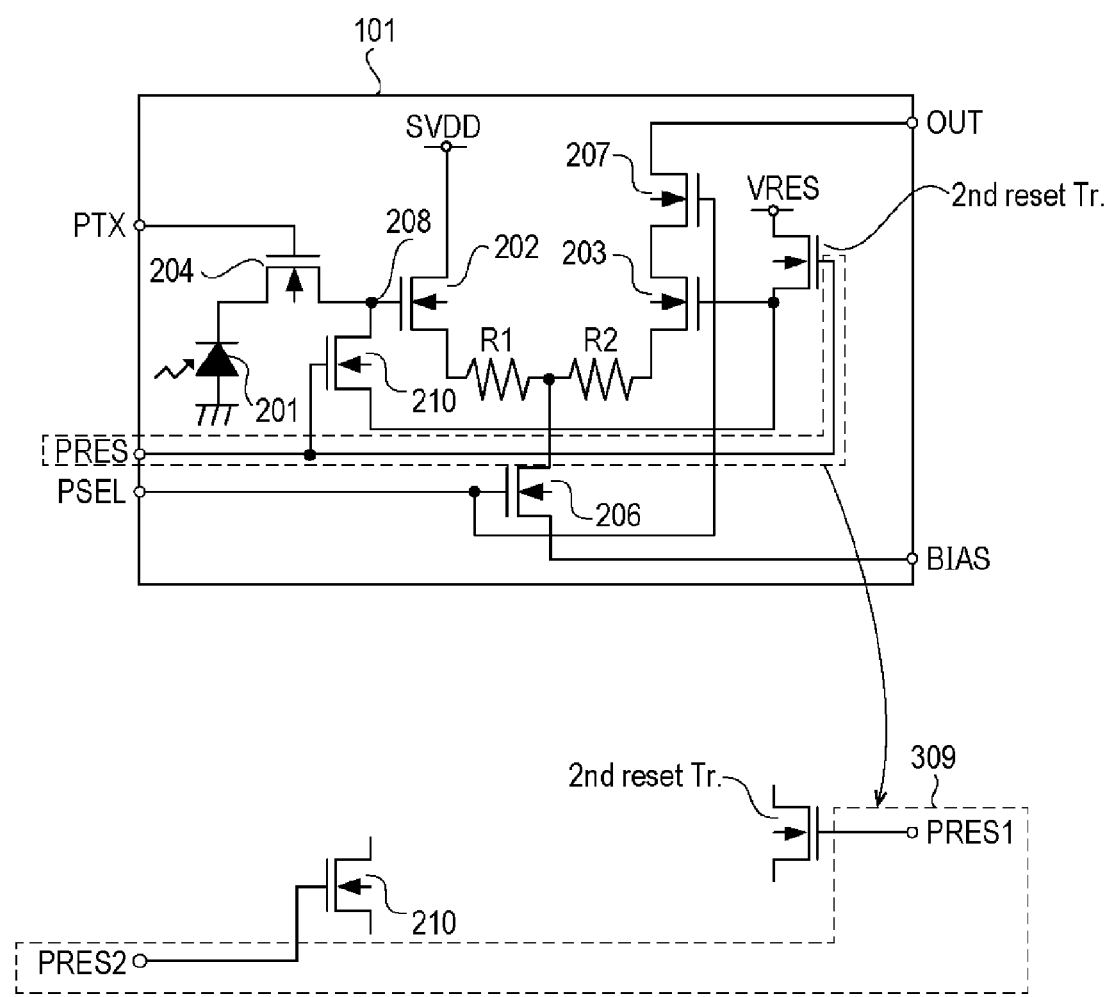
FIG. 3 illustrates an equivalent circuit of an exemplary pixel of an exemplary embodiment.

Other exemplary structure of the pixel 101 will be described in detail. FIG. 3 illustrates an equivalent circuit of the pixel 101 of the present embodiment. The reset transistor 209 in FIG. 2 is omitted in FIG. 3. Two transistors (the transfer transistor 204 and the connection transistor 210) are connected to the gate of the first input transistor 202. Two transistors (the second reset transistor and the connection transistor 210) are connected to the gate of the second input transistor 203. Accordingly, since the same number of the transistors is connected to each of the first and second input node of the differential amplifier, accuracy of the current signal may be improved. In addition, as in FIG. 2, the gates of the transistor 210 and the second reset transistor are shown tied together in a dotted enclosure. In another embodiment, the gates of these two transistors may be independently controlled by PRES1 and PRES2 as shown in a dotted enclosure 308.

In FIGS. 2 and 3, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the two input nodes of the differential amplifier may be improved.

Further, a third selection transistor may be provided in an electrical path between the drain of the first input transistor 202 and the power source line. In case both of the second and third selection transistors are provided, the accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that both transistors 202, 203 are turned off. For example, such voltage may be provided from the reset voltage line. In case both of the first and second selection transistors 206, 207 are omitted, the fill factor of the pixel may be improved by the reduction of the number of the pixel transistors.

Further, the pixel configuration in FIG. 2 may change such that a charge of the PD 201 may be transferred to the gate of the second input transistor 203. In other words, the transfer transistor may be provided not in an electrical path between the PD 201 and the gate of the first input transistor 202, but in an electrical path between the PD 201 and the gate of the second input transistor 203. In this case, since the same number of the transistors is connected to each of the first and second input node of the differential amplifier, the accuracy of the current signal may be improved. Each gate of the first and second input transistors 202 and 203 may be set in an electrically floating state after the reset voltage VRES is provided. Accordingly, the current signal corresponding to the difference of the voltages between the two input nodes may be output regardless of which one of the two input nodes the charge of the PD 201 is transferred to.

In FIGS. 2 and 3, the electron is used as the signal charge, and is transferred to the node 208, which is the gate of the first input transistor 202. The transfer of the electron may lower the voltage of the node 208. The more the charges are transferred, the lower the voltage of the node 208 may become. Since, in the bright situation, a large amount of charges may be transferred to the node 208, the voltage of the node 208 may be low. Since the input transistors 202, 203 have N-type channels, the amplitude of the current signal may be larger in the bright situation than in the dark situation. In another case, the electron of the PD 201 may be transferred to the gate of the second input transistor 203. In this case, the more the charges are transferred, the smaller the amplitude of the current signal may become. The dark situation may include a situation where the voltage of the node 208 has been reset and charges are not transferred to the node 208.

In FIGS. 2 and 3, the connection transistor 210 is connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 1, in one or more embodiments, the circuit for reading out the current signal corresponding to the amount of charges generated in the photoelectric conversion unit into the first output line 104, which is illustrated in each of FIGS. 2 and 3, is repeatedly or periodically arranged. That is, the circuit illustrated in any one of FIGS. 2 and 3 is provided for each of the plurality of the photoelectric conversion units. In other words, transistors included in the readout portion are repeatedly, or periodically, arranged so as to correspond to a plurality of the pixels whose signals are output to the common output line (e.g., the first output line 104).

In other embodiments, the circuit illustrated in any one of FIGS. 2 and 3 may be repeatedly, or periodically, provided every two or more of the plurality of the photoelectric conversion units. In detail, charges of two photoelectric conversion units may be transferred into the gate of the first input transistor 202, which is commonly provided for the two photoelectric conversion units. In this case, a plurality of the photoelectric conversion units may share the transistors other than the transfer transistor. Therefore the fill factor of the pixel may be improved by the reduction of the number of the pixel transistors.

In the present embodiment, each of the transistors is repeatedly, or periodically, provided so as to correspond to the plurality of the photoelectric conversion units. Each of the transistors may have the same conductivity type. Specifically, the first and second input transistors 202, 203, the transfer transistor 204, the first and second selection transistors 206, 207, the reset transistor 209 and the connection transistor 210 all are N-type channel MOS transistors. In this case, since a single conductivity type of a well may be provided in the pixel 101, the fill factor of the pixel, which is a ratio of a region that the photoelectric conversion unit occupies to a region of a single pixel, may be improved. Therefore, sensitivity and/or a saturation amount of charges may be improved. However, a part of these transistors may have a different conductivity type from the others.

In the present embodiment, the electron may be used as the signal charge, and the N-type channel transistors may be provided in the pixel. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is not repeatedly arranged but is provided commonly for a plurality of the photoelectric conversion units may be included in the circuit for reading out the current signal corresponding to the amount of charges generated in the photoelectric conversion unit into the first output line 104. For example, the bias current source 102 in FIG. 1 may be included in the circuit for reading out, or the readout portion, because it may drive the differential amplifier by providing the bias current. In FIG. 1, the bias current source 102, however, is provided for each of the plurality of the pixel rows. Thus, the bias current source 102 is not an element which is repeatedly, or periodically, arranged so as to correspond to the plurality of the photoelectric conversion units whose signals are to be output to the common output line (the first output line 104). Thus, the bias current source 102 may include a P-type channel transistor.

Figure 4:
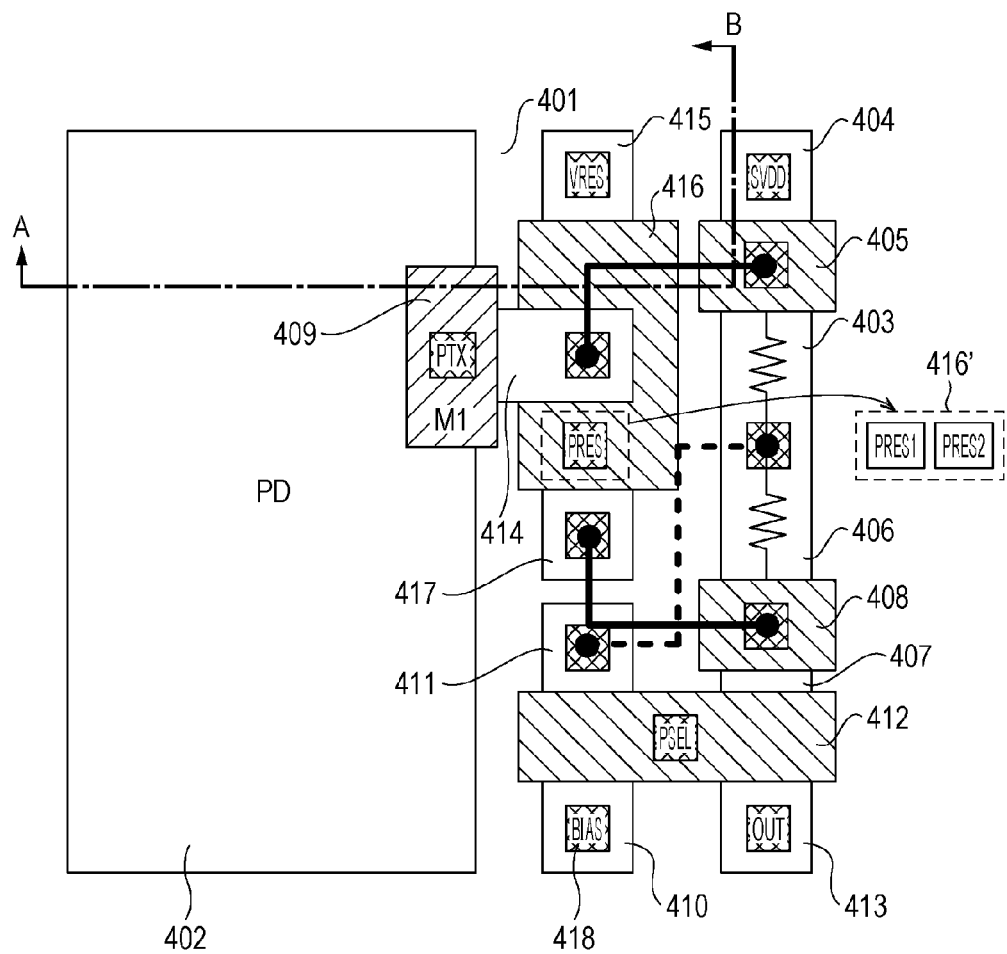
FIG. 4 is a schematic illustration of the planar structure of an exemplary pixel of an exemplary embodiment.

FIG. 4 is a schematic illustration of the planar structure of the pixel illustrated in FIG. 2. The pixel circuit may be provided in a semiconductor substrate, such as a silicon substrate or the like. The semiconductor substrate includes an active region, which is defined by an element isolation portion 401. Elements, such as photodiodes, transistors and resistors, may be provided in the active region.

The element isolation portion 401 may include an isolation structure such as LOCOS (Local Oxidation of Silicon) or STI (Shallow Trench Isolation). In another case, the element isolation portion 401 may include an isolation structure using a PN junction. The element isolation portion 401 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 201 includes a semiconductor region 402. The first input transistor 202 may include semiconductor regions 403, 404 and a gate electrode 405 as the source, the drain and the gate. The second input transistor 203 may include semiconductor regions 406, 407 and a gate electrode 408 as the source, the drain and the gate. The semiconductor regions 403 and 406 may respectively form the resistors R1 and R2. The transfer transistor 204 may include a gate electrode 409 as the gate. The first selection transistor 206 may include semiconductor regions 410, 411 and a gate electrode 412 as the source, the drain and the gate. The second selection transistor 207 may include semiconductor regions 407, 413 and the gate electrode 412 as the source, the drain and the gate. The reset transistor 209 may include semiconductor regions 414, 415 and a gate electrode 416 as the source, the drain and the gate. The connection transistor 210 may include the semiconductor regions 414, 417 and the gate electrode 416 as the source, the drain and the gate.

Contact plugs 418 are provided for the gate electrode and the semiconductor regions each of which forms the source or the drain. The semiconductor regions and the gate electrode may be connected to conductive members included in interconnections via the contact plugs 418. For example, the semiconductor region 414 and the gate electrode 405 are connected to each other by the interconnection, and form the node 208 in FIG. 2.

As shown in FIG. 4, two nodes, which are supposed to be electrically connected to each other, may be formed of a common semiconductor region or a common gate electrode. For example, since the drain of the second input transistor 203 may be connected to the source of the second selection transistor 207, both nodes are formed of the semiconductor region 407. In another case, however, the two nodes may be formed of two separated semiconductor regions. The gate of the reset transistor 209 and the gate of the connection transistor 210 may be formed of two separated gate electrodes to correspond to two reset control signals PRES1 and PRES2 as shown in a dotted enclosure 416'. Although, in FIG. 7, the resistors R1 and R2 are formed of the semiconductor regions 403 and 406, the resistors R1 and R2 may be thin film resistors formed of poly-silicon as the like.

As shown in FIG. 4, the structure from the gate electrode 405 to the gate electrode 408 may have symmetry with respect to a line. In this case, accuracy of the current signal may be improved because the symmetrical characteristic of the differential amplifier may be improved.

Figure 5:
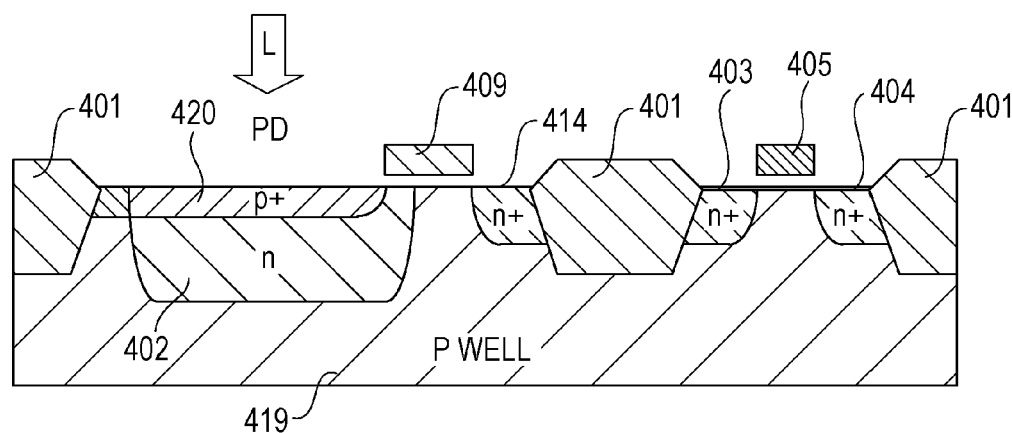
FIG. 5 is a schematic illustration of the cross-sectional structure of an exemplary pixel of an exemplary embodiment.

FIG. 5 is a schematic illustration of an exemplary cross-sectional structure taken along a line A-B in FIG. 4. The PD 201, the transfer transistor 204 and the first input transistor 202 are exemplarily illustrated in FIG. 5. The same reference symbol is used to indicate elements in FIG. 5 and FIG. 4 which perform the same or a similar function, and detailed descriptions of the elements are not repeated.

The PD 201 includes an N-type semiconductor region 402. The N-type semiconductor region 402 may accumulate generated charges therein. The first input transistor 202 may include N-type semiconductor regions 403 and 404 as the source and the drain. Accordingly, the first input transistor 202 may have an N-type channel. These N-type semiconductor regions may be provided in a P-type well 419. The P-type well 419 may be provided with the ground voltage GND.

The P-type well 419 may be a semiconductor region formed by diffusing or implanting impurities into the semiconductor substrate. In another case, the P-type well 419 may be formed by an epitaxial layer grown on the semiconductor substrate.

A P-type semiconductor region 420 is provided adjacent to the N-type semiconductor region 402 of the PD 201. The P-type semiconductor region 420 may be connected to the P-type well 419 and be provided with the ground voltage GND. The P-type semiconductor region 420 may reduce a noise caused by a dark current generated at the interface of the semiconductor substrate and an insulator.

Figure 8:
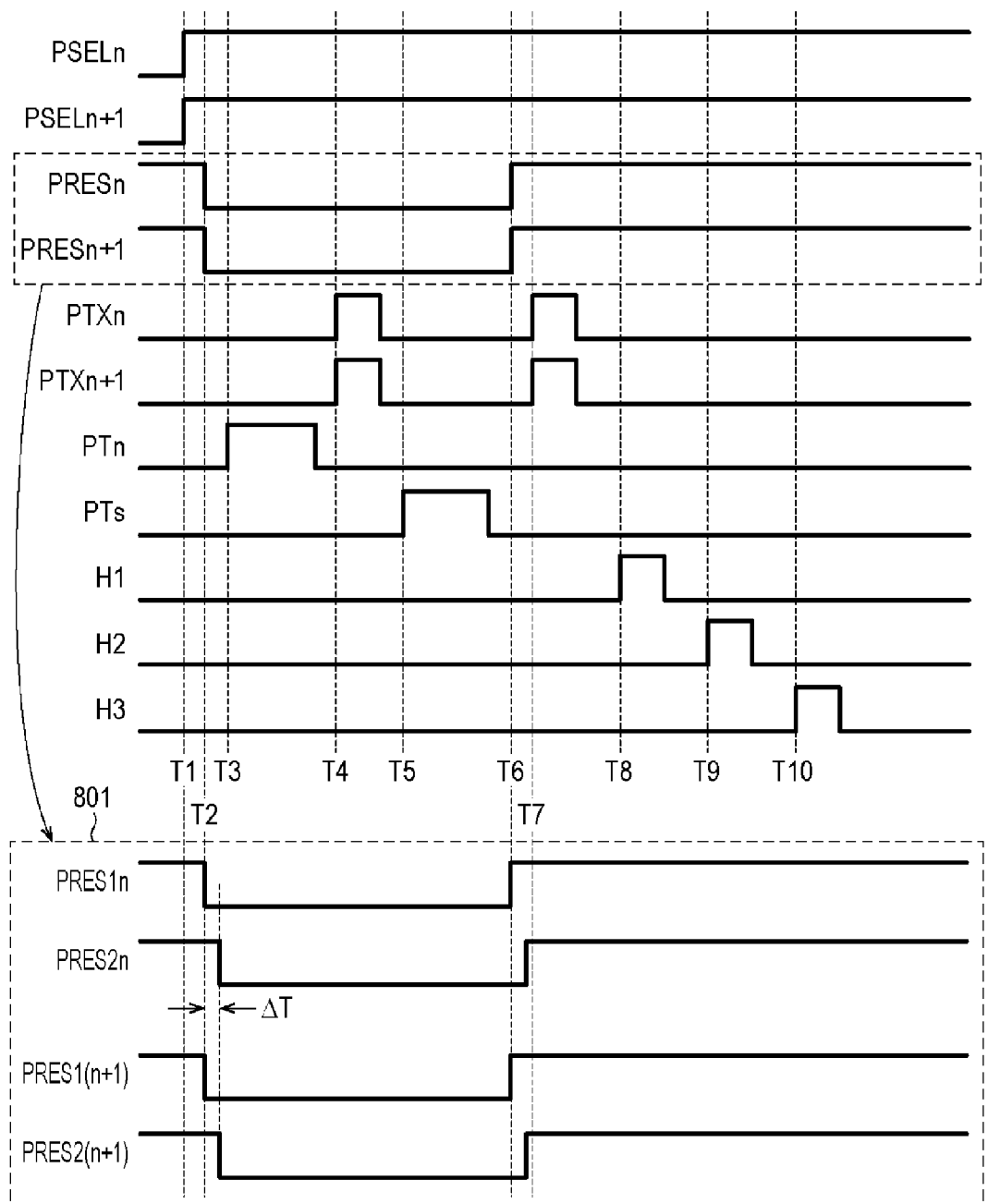
FIG. 8 is a timing chart of an exemplary operation for an exemplary embodiment.

In case the transistors which included in the pixel circuit have the same conductivity type, a single conductivity type of a well may be used in the pixel as shown in FIG. 8. Therefore, the fill factor of the pixel, which is a ratio of a region that the photoelectric conversion unit occupies to a region of a single pixel, may be improved. Therefore, sensitivity and/or a saturation amount of charges may be improved.

In the present embodiment, the PD 201 which accumulates electrons may be formed by providing N-type semiconductor region 402 in the P-type well 419. In this case, since the photoelectric conversion unit and the transistors may be provided in the same well, the fill factor of the pixel may be improved. Therefore, sensitivity and/or a saturation amount of charges may be improved. When hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 5, light may enter the semiconductor substrate in a direction indicated by L. That is, the photoelectric conversion device illustrated in FIG. 5 is a front-side illuminated type.

Figure 6:
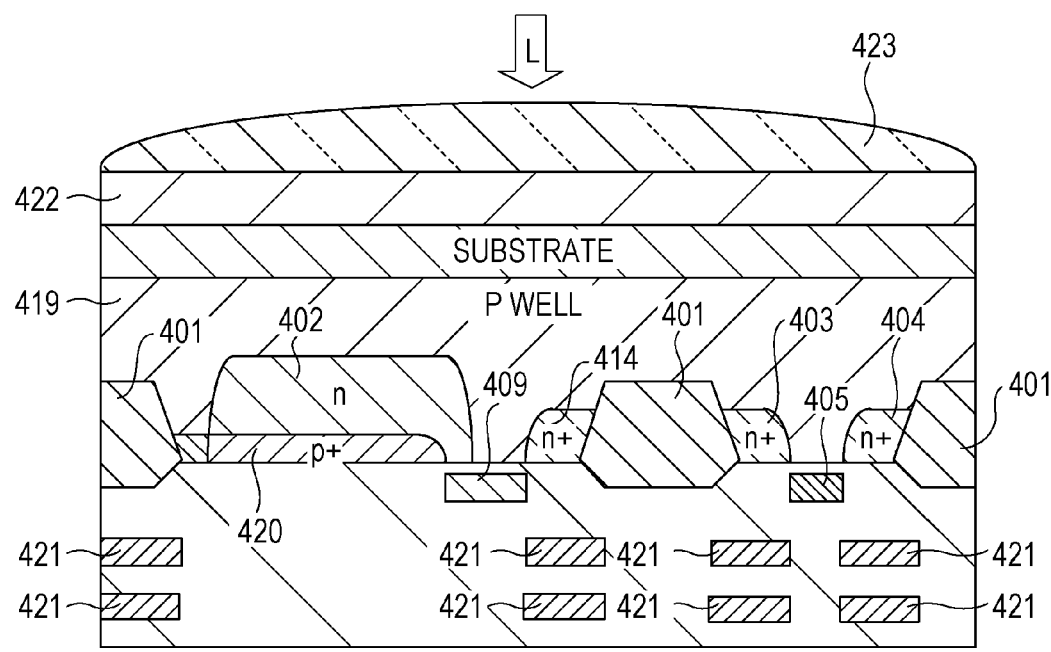
FIG. 6 is a schematic illustration of the cross-sectional structure of an exemplary pixel of an exemplary embodiment.

FIG. 6 is a schematic illustration of another exemplary cross-sectional structure taken along a line A-B in FIG. 4. The PD 201, the transfer transistor 204 and the first input transistor 202 are exemplarily illustrated in FIG. 6.

The photoelectric conversion device illustrated in FIG. 6 is a back-side illuminated type. In detail, light may enter the semiconductor substrate from a side (back side) opposite to a side (front side) on which the gate electrodes of the transistors are provided. The reference symbol L in FIG. 6 indicates a direction in which light may enter the semiconductor substrate.

The same reference symbols are used to indicate elements in FIG. 6 and FIG. 5 which perform the same or a similar function, and detailed descriptions of the elements are not repeated. A conductive member 421 included in an interconnection is shown in FIG. 6. Further, a color filter 422 and a lens 423 may be provided on the back side of the semiconductor substrate.

In the back-side illuminated type photoelectric conversion device, conductive members and gate electrodes, which may shield incident light, may be reduced on a side (back side) through which the incident light may enter the semiconductor substrate. Accordingly, sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 421, the first side being opposite to a second side of the conductive member 421 on which the PD 201 is provided. In another aspect of view, the (first) semiconductor substrate where the PD 201 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 201.

Figure 7:
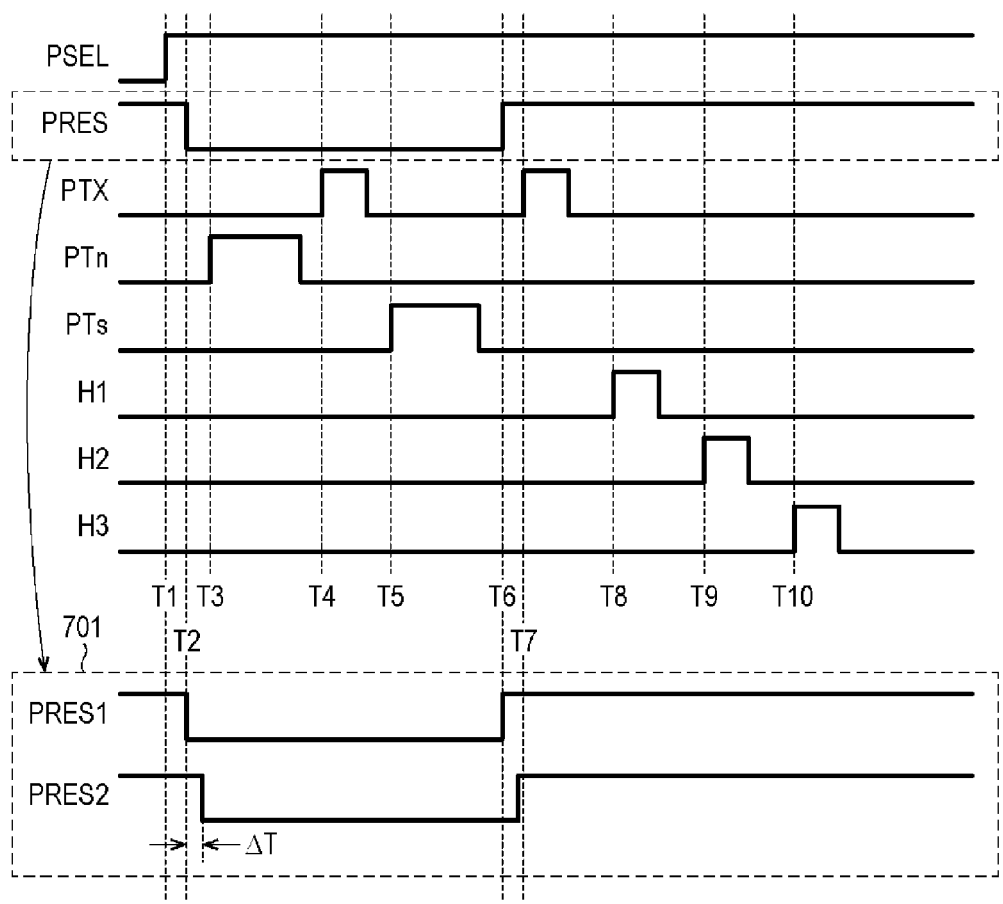
FIG. 7 is a timing chart of an exemplary operation for an exemplary embodiment.

Hereinafter, an exemplary operation for the photoelectric conversion device according to the present embodiment will be described. FIG. 7 is a timing chart of the drive signals. The drive signals PSEL, PRES, PTX, PTN and PTS, illustrated in FIG. 7, are respectively provided for the PSEL node, the PRES node, the PTX node, the PTN node and the PTS node, illustrated in FIG. 1. In another embodiment, there may be two drive signals PRES1 and PRES2 as shown in a dotted enclosure 701. The drive signal H1 is provided for the gates of the third and fourth switches 117, 118 of the leftward pixel column in FIG. 1. The drive signal H2 is provided for the gates of the third and fourth switches 117, 118 of the middle pixel column in FIG. 1. The drive signal H3 is provided for the gates of the third and fourth switches 117, 118 of the rightward pixel column in FIG. 1.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES is of a high level. The other drive signals are of low levels. At this time, the reset voltage VRES is provided for the node 208 and the gate of the second input transistor 203. Since the transfer transistor 204 is turned off in this period, charges generated by photoelectric conversion may be accumulated in the PD 201.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 208 may become electrically floating. In the pixel illustrated in FIG. 2, the node 208 and the gate of the second input transistor 203 may become electrically floating.

At T3, the PTN turns into a high level. When the PTN is of a high level, the voltage signal converted from the current signal from the pixel may be stored in the CTN capacitor 115. At T3, the voltage of the input node (node 208) of the pixel amplification unit is the reset voltage VRES. Accordingly, a voltage signal corresponding to a current signal that the pixel outputs when in a state of being reset is stored in the CTN capacitor 115. The current signal that the pixel outputs when in a state of being reset, or the voltage signal converted therefrom, may contain a reset nose, which is generated when the reset transistor turns off. After a period passes since T3, the PTN turns into a low level.

At T4, the PTX turns into a high level, whereby the charge generated at PD 201 may be transferred to the node 208. At this time, the whole charges of the PD 201 may be transferred to the node 208. After a period passes since T4, the PTX turns into a low level.

By the transfer of the charges to the node 208, the voltage of the node 208 may change from the reset voltage VRES. The amount of the voltage change may be defined by the amount of the charges transferred. On the other hand, the voltage of the gate of the second input transistor 203 may be kept at the reset voltage VRES. Thus, the voltage difference according to the amount of the charges may emerge between the two input nodes of the differential amplifier, and the differential amplifier may output the current signal according to the voltage difference.

At T5, the PTS turns into a high level. When the PTS is of a high level, the voltage signal converted from the current signal from the pixel may be stored in the CTS capacitor 116. At T5, the voltage of the input node (node 208) of the pixel amplification unit is a voltage corresponding to the amount of the charges generated by the incident light. Accordingly, a voltage signal corresponding to the amount of the incident light is stored in the CTS capacitor 116. The voltage signal corresponding to the amount of the incident light may contain a reset nose, which is generated when the reset transistor turns off. After a period passes since T5, the PTS turns into a low level.

The PRES turns into a high level at T6 and the PTX turns into a high level at T7, whereby the reset voltage VRES may be provided for the node 208 and the cathode of the PD 201. In other words, the pixel 101 may be reset. In another case, the PRES and the TTX turn into high levels simultaneously. In further another case, the PTX turns into a high level before the PRES turns into a high level. After a period passes since T7, the PTX turns into a low level. After the pixel has been reset, the PSEL turns into a low level. The PSEL may turn into a low level before the signal is output from the pixel to be read out thereafter. When there are two independent reset control signals PRES1 and PRES2 that correspond to transistors 209 and 210, respectively, the timing for these signals are shown in the dotted enclosure 701. In this embodiment, the PRES1 turns into a low level to turn off the transistor 209. After a time interval ΔT, the PRES2 signal turns into a low level to turn off the transistor 210. This operation is further explained in the following paragraphs.

From T8, the signal which is stored in the voltage signal storing portion of each pixel column is serially read out. At T8, the H1 turns into a high level, whereby the voltage signals stored in the CTN capacitor 115 and CTS capacitor 116 of the leftward pixel column in FIG. 1 are read out into the output portion. At T9, the H2 turns into a high level, whereby the voltage signals stored in the CTN capacitor 115 and CTS capacitor 116 of the middle pixel column in FIG. 1 are read out into the output portion. At T10, the H3 turns into a high level, whereby the voltage signals stored in the CTN capacitor 115 and CTS capacitor 116 of the rightward pixel column in FIG. 1 are read out into the output portion.

In one or more embodiments, reading out of signals from the pixels in a different row may start after the all of the voltage signals stored in the voltage signal storing portions are read out. In other embodiments, reading out of signals from the pixels in a different row may start after the voltage signals are stored in the voltage signal storing portions. At T7, for example, reading out for the pixel to be read out sequentially is started.

In other embodiments, the selection transistor may be omitted. In this case, the PSEL is not provided. Alternatively, a voltage for turning off one or both of the first and second input transistors 202, 203 may be provided for the gates thereof during a corresponding period, in which the PSEL is of a low level. Accordingly, the pixel may be set in a non-selected state.

In the pixel corresponding to FIG. 2, a timing of turning off the reset transistor 209 and a timing of turning off the connection transistor 210 may be offset. In detail, the reset transistor 209 turns off before the connection transistor 210 turns off. This is illustrated by the timing shown in the enclosure 701 in FIG. 7. By this order of the operation, the reset noises, which are generated when the reset transistor 209 turns off, may be substantially equally divided into the two input nodes. As the result, since the divided noises may cancel each other by the differential amplification, noises in the current signal may be reduced.

The read out of the signal that the pixel outputs when in a state of being reset may be omitted. Even though the read-out of the signal that the pixel outputs when in a state of being reset is omitted, an offset noise of the pixel and the reset noise may be reduced because the pixel amplification unit is the differential amplifier. However, with the read-out of the current signal that the pixel outputs when in a state of being reset, offset noises generated in the subsequent states of the pixel may be reduced.

Hereinafter, another exemplary operation for the photoelectric conversion device according to one or more embodiments will be described. In this operation, the drive signal PSEL may be provided parallel for the pixels in a plurality of the pixel rows. Thus, the pixels in the plurality of the pixel rows may simultaneously output the current signals to the same first output line 104. According to this way of operation, the current signals may be summed up or averaged at the first output line 104. In this case, each of the drive signals PSEL, PRES, PTX may be provided for the pixels in the plurality of the pixel rows simultaneously.

FIG. 8 is a timing chart of the drive signals for the above described addition or average. The drive signals PSELn, PRESn and PTXn are respectively provided for the PSEL node, the PRES node and the PTX node of the pixel included in the pixel row N. The drive signals PSELn+1, PRESn+1 and PTXn+1 are respectively provided for the PSEL node, the PRES node and the PTX node of the pixel included in the pixel row N+1. In addition, similar to FIG. 7, the drive signals PRESn and PRESn+1 are shown in dotted enclosure to indicate there is another alternative embodiment shown in a dotted enclosure 801 which contains the drive signals PRES1n, PREST2n, PRES1(n+1), and PRES2(n+1). The signals PRES2n and PRES2(n+1) are shown to be offset by a time interval ΔT with respect to the signals PRES1n and PRES2n, respectively.

As illustrated in FIG. 8, the drive signals for the pixel row N and for the pixel row N+1 are synchronized. Thus, the current signals of the pixels included in a plurality of the pixel rows may be output to the first output line 104 in parallel. The detailed operation in the FIG. 8 is the same as in FIG. 7, and the detailed description is not repeated.

For addition of two current signals from two pixels, the bias current source 102 may output the bias current which has the amplitude twice as large as that of the bias current the bias current source 102 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

As described above, in one or more embodiments, sensitivity may be improved. In one or more embodiments, image quality may be improved by the reduction of reset noise.

Second Exemplary Embodiment

Figure 9:
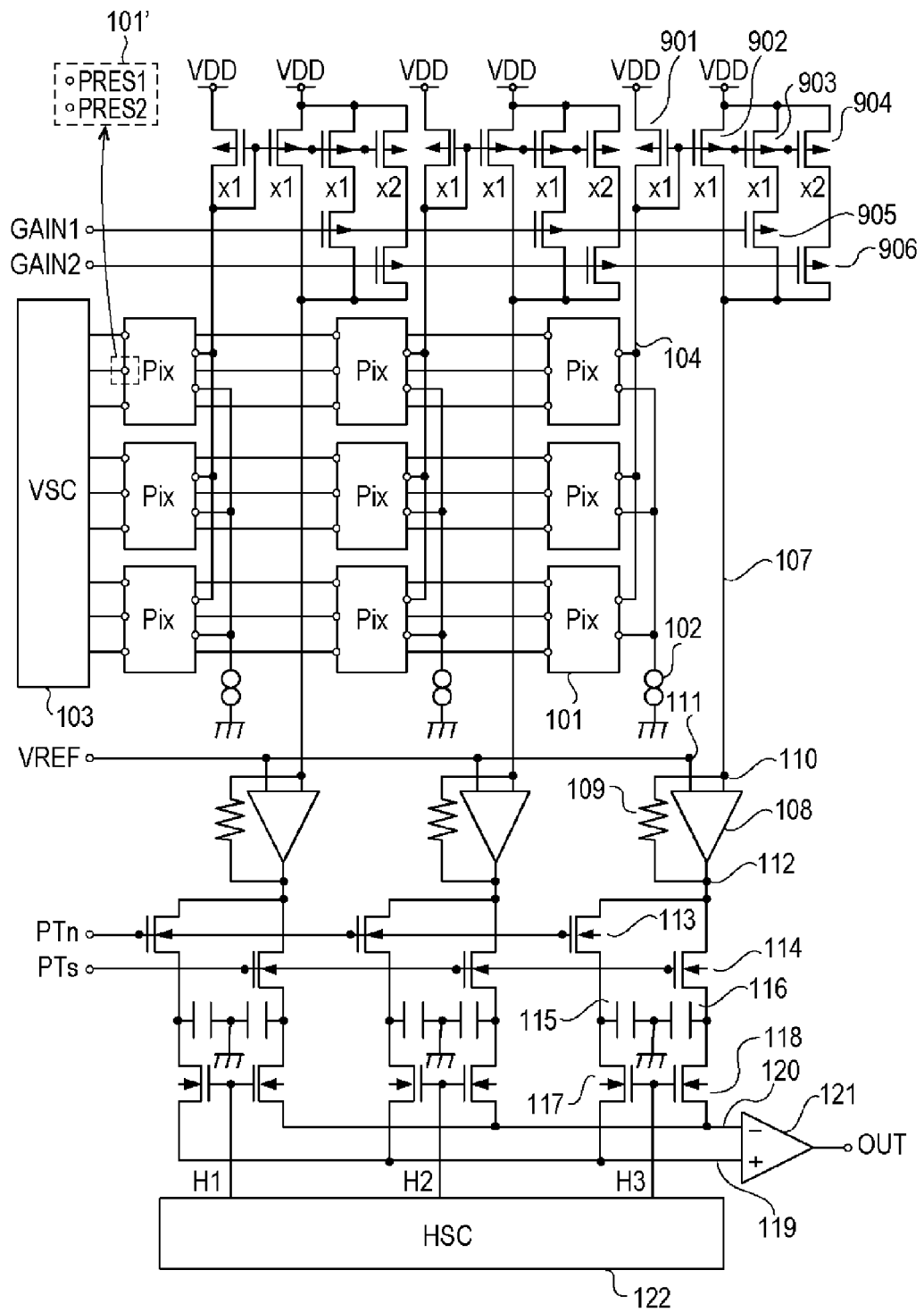
FIG. 9 illustrates an equivalent circuit of a second exemplary embodiment.

FIG. 9 illustrates an equivalent circuit of a photoelectric conversion device according to one or more embodiments. The same reference symbols are used to indicate elements in FIG. 9 and FIG. 1 which perform the same or a similar function, and detailed descriptions of the elements are not repeated. In addition, similar to FIG. 1, the PRES node is shown in a dotted enclosure to indicate that there is another alternative embodiment shown in a dotted enclosure 101' which has two nodes: PRES1 and PRES2 that correspond to two reset control signals.

The photoelectric conversion device of the present embodiment includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion outputs the voltage signal to the outside of the device.

In the present embodiment, the amplification factor of the current mirror circuit is controllable. The other features may be the same as the above described embodiment. The detailed explanation of the same features as the above described embodiment is not repeated.

The current mirror circuit includes an input-side transistor 901 and three output-side transistors 902, 903 and 904. The input and output-side transistors 901, 902, 903, and 904 are P-type channel MOS transistors.

The gate and the drain of the input-side transistor 901 are shorted. The source of the input-side transistor 901 is electrically connected to a power source line. The power source line may provide the source of the input-side transistor 901 with a power source voltage VDD. The first output line 104 is electrically connected to the drain of the input-side transistor 901 and the gate which is shorted to the drain of the input-side transistor 901.

The output-side transistors 902, 903 and 904 are arranged in parallel. In detail, the sources of the output-side transistors 902, 903 and 904 are respectively connected to the power source line. The power source line may provide the sources of the output-side transistors 902, 903 and 904 with the power source voltage VDD. The gates of the output-side transistors 902, 903 and 904 are respectively connected to the gate of the input-side transistor 901. The drains of the output-side transistors 902, 903 and 904 are respectively connected to the second output line 107.

The input-side transistor 901 and the first and second output-side transistors have the substantially same channel widths. The third output-side transistor 904 has twice as a wide channel width as the input-side transistor 901. The input and output-side transistors 901, 902, 903 and 904 have the substantially same channel length.

A first gain control switch 905 is arranged in an electrical path between the drain of the second output-side transistor 903 and the second output line 107. The first gain control switch 905 is a P-type channel MOS transistor. A drive signal GAIN1 may control the first gain control switch 905 to be turned on or off.

A second gain control switch 906 is arranged in an electrical path between the drain of the third output-side transistor 904 and the second output line 107. The second gain control switch 906 is a P-type channel MOS transistor. A drive signal GAIN2 may control the second gain control switch 906 to be turned on or off.

The first and second gain control switches 905 and 906 may control the amplification factor of the current mirror circuit. The first and second gain control switches 905 and 906 may be included in an amplification factor control portion. By using the two gain control switches 905 and 906, four gain settings may be set.

When both of the first and second gain control switches 905 and 906 are turned off, the second and third output-side transistors 903 and 904 are disconnected from the second output line 107. Accordingly, only the first output-side transistor 902 of the three may be connected to the second output line 107. In this case, the mirrored current signal may be output at the amplification factor of about 1.

When the first gain control switch 905 is turned on and the second gain control switch 906 is turned off, the third output-side transistors 904 is disconnected from the second output line 107. Accordingly, the first and second output-side transistors 902 and 903 of the three may be connected to the second output line 107. Since the output-side transistors are arranged in parallel, a virtual output-side transistor which has twice as a wide channel width as the input-side transistor 901 may be considered. In this case, the mirrored current signal may be output at the amplification factor of about 2.

When the first gain control switch 905 is turned off and the second gain control switch 906 is turned on, the second output-side transistors 903 is disconnected from the second output line 107. Accordingly, the first and third output-side transistors 902 and 904 of the three may be connected to the second output line 107. Since the output-side transistors are arranged in parallel, a virtual output-side transistor which has three times as a wide channel width as the input-side transistor 901 may be considered. In this case, the mirrored current signal may be output at the amplification factor of about 3.

When both of the first and second gain control switches 905 and 906 are turned on, all of the three output-side transistors 902, 903 and 904 may be connected to the second output line 107. Since the output-side transistors are arranged in parallel, a virtual output-side transistor, which has four times as a wide channel width as the input-side transistor 901 may be considered. In this case, the mirrored current signal may be output at the amplification factor of about 4.

As mentioned above, the amplification factor of the current mirror circuit is controllable.

In FIG. 9, three output-side transistors are arranged. However, the number of the output-side transistors is not limited to three. According to the size of each of the transistors, the amplification factor may be determined.

In the case where the current signals from the pixels are individually output, the amplification factor may be changed. For example, the amplification factor may be controlled to be large when the current signal from the pixel has small amplitude, while to be small when the current signal from the pixel has large amplitude.

The amplification factor may be changed between the case where the current signal from a single pixel is output and the case where the current signals form a plurality of the pixels are simultaneously output. For adding or averaging the current signals, a small amplification factor may be used. The small amplification factor may result in a large dynamic range of the subsequent stages.

An exemplary structure of the pixel may be the same as the above described embodiment. The equivalent circuit of the pixel is illustrated in FIG. 2 or 3. The exemplary planar and cross-sectional structures of the pixel are illustrated in FIGS. 4, 5 and 6.

An exemplary operation for the photoelectric conversion device according to the present embodiment may be the same as the above described embodiment. The photoelectric conversion device may be operated according to the drive signals illustrated in FIG. 7 or in FIG. 8.

In the present embodiment, since the amplification factor of the current mirror circuit is controllable, a wide dynamic range and a high signal-to-noise ratio (SN ratio) may be obtained. For capturing a dark object, improvement in SN ratio may be obtained because of a high gain of the current mirror circuit. For capturing a bright object, which is less effected by noises, improvement in dynamic range may be obtained because of a low gain of the current mirror circuit.

Third Exemplary Embodiment

Figure 10:
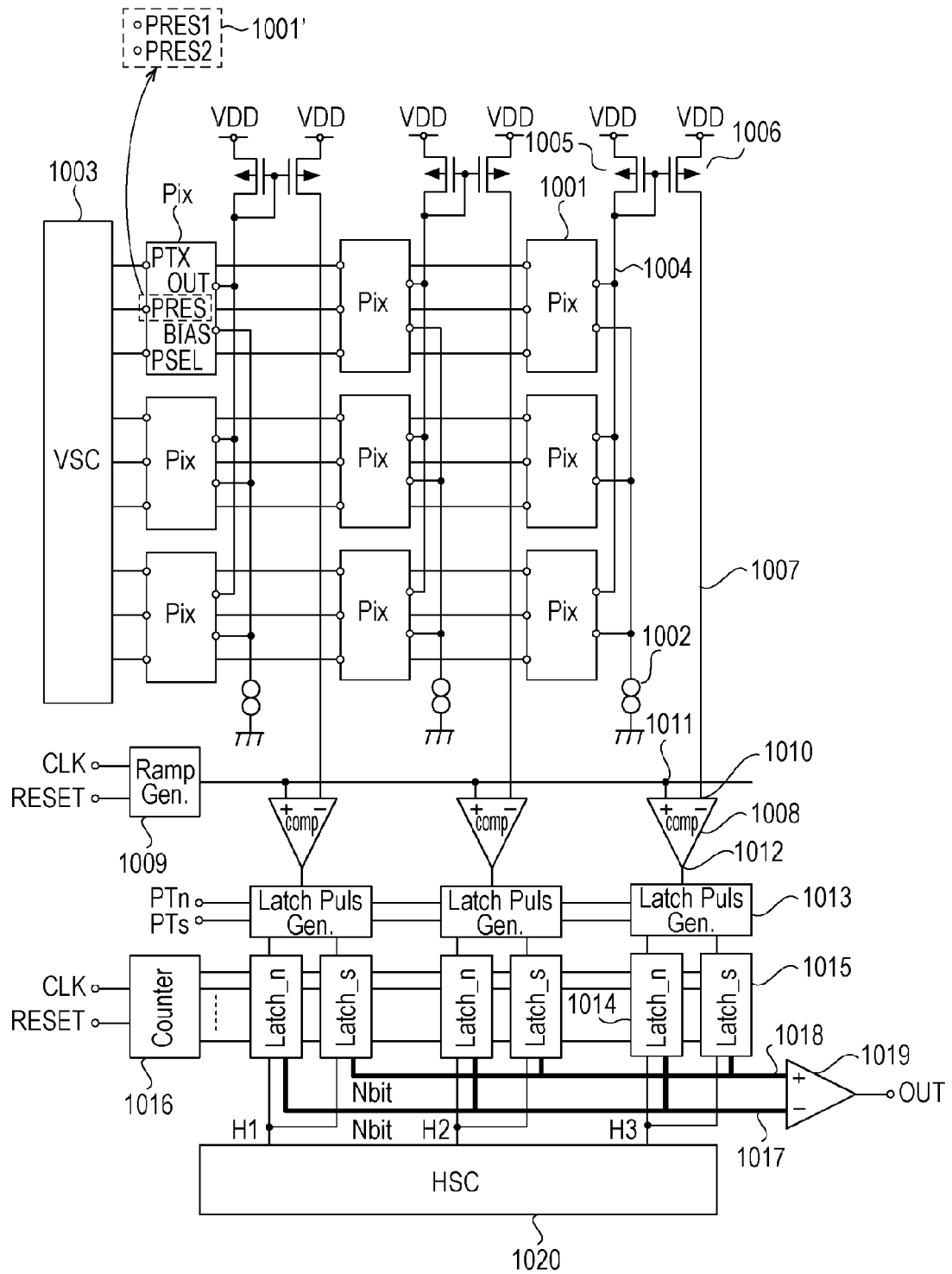
FIG. 10 illustrates an equivalent circuit of a third exemplary embodiment.

FIG. 10 illustrates an equivalent circuit of a photoelectric conversion device according to one or more embodiments.

The photoelectric conversion device of the present embodiment includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which is output from the pixel as an analog signal, into a digital signal. According to drive signals the horizontal scanning circuit provides, the digital signal is read out to the output portion. The output portion outputs the digital signal to the outside of the device.

The A-D convertor includes a comparator, a latch pulse generator, a memory and a counter. The current signals from the pixels are converted into the digital signals at respective pixel columns. The comparator compares the current signal from the pixel with a ramp current signal. The comparator outputs a pulse based on a timing of an inversion of the amplitude relationship between the current signal from the pixel and the ramp current signal. According to the pulse the comparator outputs, the latch pulse generator input a latch pulse to a latch circuit of the memory. The memory stores a count value that the counter is outputting when the latch pulse is input to the memory. The count value stored in memory is the digital signal converted from the current signal.

In the present embodiment, at each pixel column, the current signal is converted into the digital signal. Further, in the present embodiment, the current signal from the pixel is mirrored by the current mirror circuit, and a mirrored current signal is input to the comparator for comparing with the ramp current signal.

Each part of the photoelectric conversion device of the present embodiment will be described in detail. The plurality of pixels 1001 are arranged so as to form a pixel array including three rows and three columns. The number of the pixels 1001 is not limited. For example, the plurality of pixels 1001 are arranged so as to form a pixel array including more than 1000 rows and more than 1500 columns. In another case, the plurality of pixels 1001 may be arranged in a line so as to form a line sensor.

Signals from the pixels 1001 included in a single pixel column may be processed in common circuitry. In the following description, exemplary one of the pixel columns will be explained. The other pixel columns may have the same structure, configuration and/or circuitry as the exemplary one.

The pixel 1001 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 1001 may be a signal source configured to output a current signal. The pixel 1001 includes OUT node, via which the current signal from the pixel 1001 is output. The pixel 1001 may further include a BIAS node, via which a bias current is provided from a bias current source, and a plurality of nodes (PTX node, PRES node and PSEL node), via which drive signals are provided. The detailed structure of the pixel 1001 will be described later.

The BIAS node of the pixel 1001 is electrically connected to the bias current source 1002. A plurality of the pixel 1001 may be electrically connected to the common bias current source 1002. For example, the pixels 1001 included in a single pixel column are electrically connected to the common bias current source 1002. In another case, a bias current source 1002 may be provided for each of the pixels 1001 in the pixel column.

The PTX node, the PRES node and the PSEL node are electrically connected to the vertical scanning circuit 1003. The vertical scanning circuit 1003 may provide a common drive signal for the pixels 1001 included in a single pixel row. Further, the vertical scanning circuit 1003 may provide the pixels included in different rows from each other with independent drive signals. According to the drive signals the vertical scanning circuit provides, the signals are read out from the pixels 1001 on the pixel row basis. In addition, similar to FIG. 1, the PRES node is shown in a dotted enclosure to indicate that there is another alternative embodiment shown in a dotted enclosure 1001' which has two nodes: PRES1 and PRES2 that correspond to two reset control signals.

The OUT node of the pixel 1001 is electrically connected to a first output line 1004. The OUT nodes of a plurality of the pixels 1001 may be electrically connected to the common first output line 1004. For example, the OUT nodes of the pixels 1001 included in a single pixel column are electrically connected to the common first output line 1004. Thus, the current signals from the plurality of the pixels 1001 may be output to the first output line 1004.

The first output line 1004 is electrically connected to the current mirror circuit. An output node of the current mirror circuit is electrically connected to a second output line 1007. The current mirror circuit includes an input-side transistor 1005 and an output-side transistor 1006. The input-side and output-side transistors 1005, 1006 are P-type channel MOS (Metal Oxide Semiconductor) transistors. The gate and the drain of the input-side transistor 1005 are shorted. The source of the input-side transistor 1005 is electrically connected to a power source line. The power source line may provide the source of the input-side transistor 1005 with a power source voltage VDD. The gate of the output-side transistor 1006 is electrically connected to the gate of the input-side transistor 1005. The source of the output-side transistor 1006 is electrically connected to a power source line. The power source line may provide the source of the output-side transistor 1006 with a power source voltage VDD. The first output line 1004 is electrically connected to the drain of the input-side transistor 1005 and the gates which are shorted to the drain of the input-side transistor 1005. The drain of the output-side transistor 1006 is electrically connected to the second output line 1007.

In the current mirror circuit, a current running through the input-side transistor 1005 may be mirrored in the output-side transistor 1006. In other words, the current mirror circuit may output a current signal (a mirrored current signal) corresponding to the current signal at the first output line 1004 into the second output line 1007. The current mirror circuit may output the mirror current signal which is amplified or attenuated with respected to the current signal at the first output line 1004. The amplification (or attenuation) factor may be determined according to a ratio of the sizes of the input and output-side transistors 1005, 1006. For example, in case that the input and output-side transistors 1005, 1006 have the substantially same channel length, the amplification (or attenuation) factor may be the ratio of the channel widths.

The current signal at the second output line 1007 is input to the A-D convertor, and converted into a digital signal. The A-D convertor includes a comparator 1008. The comparator 1008 has a signal input node 1010, a reference current input node 1011 and output node 1012. The second output line 1007 is electrically connected to the signal input node 1010. The reference current input node 1011 of the comparator 1008 is electrically connected to a ramp current signal source 1009.

The comparator 1008 may compare the current signal input to the signal input node 1010 with a ramp current signal, which is the reference current signal, and output a voltage signal corresponding to the amplitude relationship of the current signals. In detail, the comparator 1008 may output a first voltage when the current signal from the pixel 1001 is larger than the ramp current signal. The comparator 1008 may output a second voltage, which is different from the first voltage, when the ramp current signal is larger than the current signal from the pixel 1001. For example, the first voltage may be near the ground voltage GND, and the second voltage near the power source VDD, or vice versa. The detailed structure of the comparator 1008 will be described later.

The ramp current signal source 1009 outputs the ramp current signal, whose amplitude may be continuously variable. In another case, the ramp current signal source 1009 outputs the ramp current signal, whose amplitude may vary step-by-step according to a clock signal CLK. The ramp current signal source 1009 is provided with a ramp reset signal via a reset node. According to the ramp reset signal, the ramp current signal is reset to an initial value. The detailed structure of the ramp current signal source 1008 will be described later.

The A-D convertor of the present embodiment includes a latch pulse generator 1013, memory (N latch circuit 1014 and S latch circuit 1015) and a counter 1016. The output node 1012 of the comparator 1008 is electrically connected to the latch pulse generator 1013. The latch pulse generator 1013 may be provided with drive signals PTN and PTS. According to the drive signals PTN and PTS, a node to which the latch pulse is output may be selected. The latch pulse generator 1013 outputs a latch pulse selectively into N latch circuit 1014 or into S latch circuit 1015 based on a timing of an inversion of the voltage signal the comparator 1008 outputs.

The N latch circuit 1014 and the S latch circuit 1015 are provided with count value from the counter 1016. When the latch pulse is input, the N latch circuit 1014 and the S latch circuit 1015 may store the count value the counter 1016 is outputting at the time.

The counter 1016 counts up or down and outputs the count value according to the clock signal CLK. When a counter reset signal is provided via a reset node of the counter 1016, the count value is reset to an initial value. The count value corresponding to the amplitude of the current signal may be stored in the latch circuit by synchronized drive signals provided for the ramp current signal source 1009 and the counter 1016. Thus, the current signal is converted into a digital signal.

The memory (the N latch circuit 1014 and the S latch circuit 1015) is electrically connected to an output portion. In detail, the N latch circuit 1014 is connected to an output circuit 1019 via a third output line 1017, and the S latch circuit 1015 is connected to the output circuit 1019 via the fourth output line 1018.

The horizontal scanning circuit 1020 provides each of the latch circuits 1014, 1015 with a drive signal. According to the drive signal from the horizontal scanning circuit 1020, each of the latch circuits 1014, 1015 outputs the stored count value as the digital signal into the output circuit 1019.

The output circuit 1019 may include LVDS (Low Voltage Differential Signaling) circuit. Additionally, the output circuit 1019 may digitally process the digital signals from the latch circuits 1014, 1015. For example, the output circuit may output differential between the digital signal of the S latch circuit 1014 and the digital signal of the N latch circuit 1015.

As described above, a signal from the pixel, which is a signal source, is converted into a digital signal and is output to the outside of the photoelectric conversion device.

Hereinafter, an exemplary structure of the pixel 1001 will be described in detail. The pixel 1001 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 11:
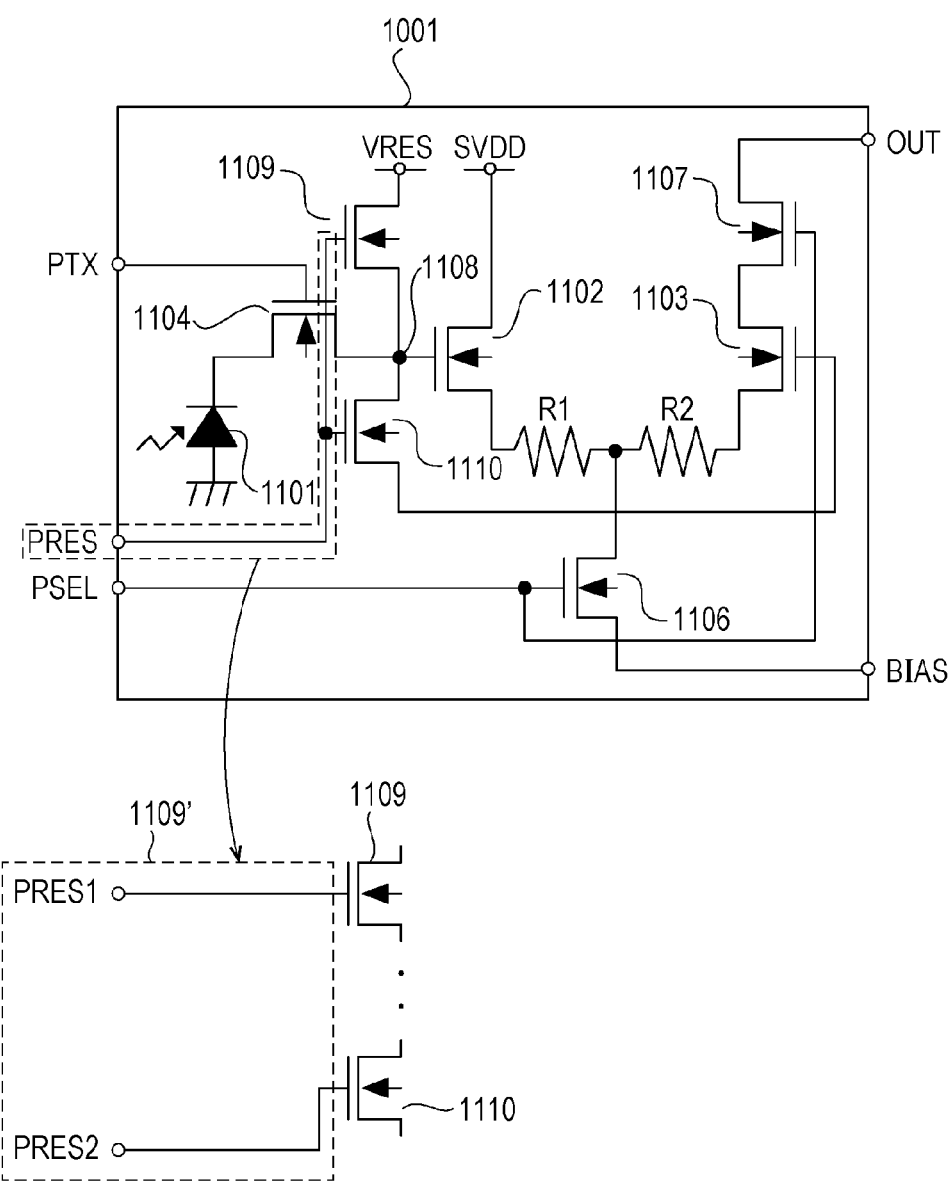
FIG. 11 illustrates an equivalent circuit of an exemplary pixel of an exemplary embodiment.

FIG. 11 illustrates an equivalent circuit of the pixel 1001 according to one or more embodiments. The photoelectric conversion unit may be, for example, a photodiode (below, PD) 1101. The pixel amplification unit may be, for example, a differential amplifier. The differential amplifier includes a first input transistor 1102 and a second input transistor 1103. The pixel 1001 may include a transfer transistor 1104, a reset transistor 1109, a connection transistor 1110, a first selection transistor 1106, a second selection transistor 1107, a resistor R1 and a resistor R2.

The anode of the PD 1101 is provided with a ground voltage GND. The cathode of the PD 1101 is electrically connected to a node 1108 via the transfer transistor 1104. The transfer transistor 1104 transfers the charges generated at the PD 1101 to the node 1108.

The gate of the first input transistor 1102 is electrically connected to the node 1108. The gate of the first input transistor 1102 is a first input node of the differential amplifier. The voltage at the gate of the first input transistor 1102 may be a voltage corresponding to the amount of charges which are transferred to the node 1108. In another aspect, the transferred charges are converted into a voltage signal at the node 1108. The drain of the first input transistor 1102 is electrically connected to the power source line. The power source line may provide the drain of the first input transistor 1102 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 1102 is electrically connected to the drain of the first selection transistor 1106 via the resistor R1.

The gate of the second input transistor 1103 is electrically connected to a source of the connection transistor 1110. The gate of the second input transistor 1103 is a second input node of the differential amplifier. The source of the second input transistor 1103 is electrically connected to the drain of the first selection transistor 1106 via the resistor R2. The drain of the second input transistor 1103 is electrically connected to the source of the second selection transistor 1107.

The node 1108 is electrically connected to the reset voltage line via the reset transistor 1109. When the reset transistor 1109 is turned on, the node 1108 is provided with the reset voltage VRES. In other words, the reset transistor 1109 may reset the voltage of the first input node of the differential amplifier.

The connection transistor 1110 is provided in an electrical path between the gate of the first input transistor 1102 (the node 1108) and the gate of the second input transistor 1103. In other words, one of the source and the drain of the connection transistor 1110 is electrically connected to the gate of the first input transistor 1102 and the other to the gate of the second input transistor 1103. When the connection transistor is turned on, the gate of the first input transistor 1102 and the gate of the second input transistor 1103 are shorted to each other. When both of the reset transistor 209 and the connection transistor 1110 are turned on, the reset voltage VRES may be provided for the gate of the second input transistor 1103 via the reset transistor 209 and the connection transistor 1110.

The drain of the first selection transistor 1106 is electrically connected to the resistor R1 and the resistor R2. The source of the first selection transistor 1106 is electrically connected to the BIAS node. The drain of the second selection transistor 1107 is electrically connected to the OUT node. The BIAS node is electrically connected to the bias current source 1002 and the OUT node is electrically connected to the first output line 1004.

The gate of the transfer transistor 1104 is electrically connected to the PTX node. The gate of the reset transistor 1109 and the gate of the connection transistor 1110 are electrically connected to the PRES node. The gates of the first and second selection transistors 1106, 1107 are electrically connected to the PSEL node. The vertical scanning circuit 1003 provides each gate of the transistors with a drive signal for controlling each of the transistors into on or off.

In FIG. 11, the gate of the reset transistor 1109 and the gate of the connection transistor 1110 are electrically connected to each other as shown in the dotted enclosure. In another case, the gate of the reset transistor 1109 and the gate of the connection transistor 1110 may be provided with independent drive signals PRES1 and PRES2 as shown in a dotted enclosure 1109'. In this case the reset transistor 1109 and the connection transistor 1110 may be controlled independently from each other. For example, when the both of the reset transistor 1109 and the connection transistor 1110 are on, the reset transistor 1109 is firstly turned off, thereafter the connection transistor 1110 is turned off.

The first input transistor 1102 and the second input transistor 1103 may form a differential pair. That is, the sources of the two transistors 1102, 1103 are electrically connected to the common bias current source 1002. A drain current of the second input transistor 1103, which is the current signal to be output from the pixel 1001, corresponds to the difference of the voltages at the gates of the two transistors 1102, 1103. Thus, the differential pair of the first input transistor 1102 and the second input transistor 1103 is included in the differential amplifier.

The first and second selection transistors 1106, 1107 may select a pixel 1001 which outputs the current signal, out of the plurality of the pixels 1001. In detail, when both of the first and second selection transistors 1106, 1107 are on, the differential amplifier may output the current signal via the OUT node.

In FIG. 11, a second reset transistor may be provided in an electrical path between the gate of the second input transistor 1103 and the reset voltage line. In this case, accuracy of the current signal may be improved because the symmetrical characteristic of the differential amplifier may be improved.

Figure 12:
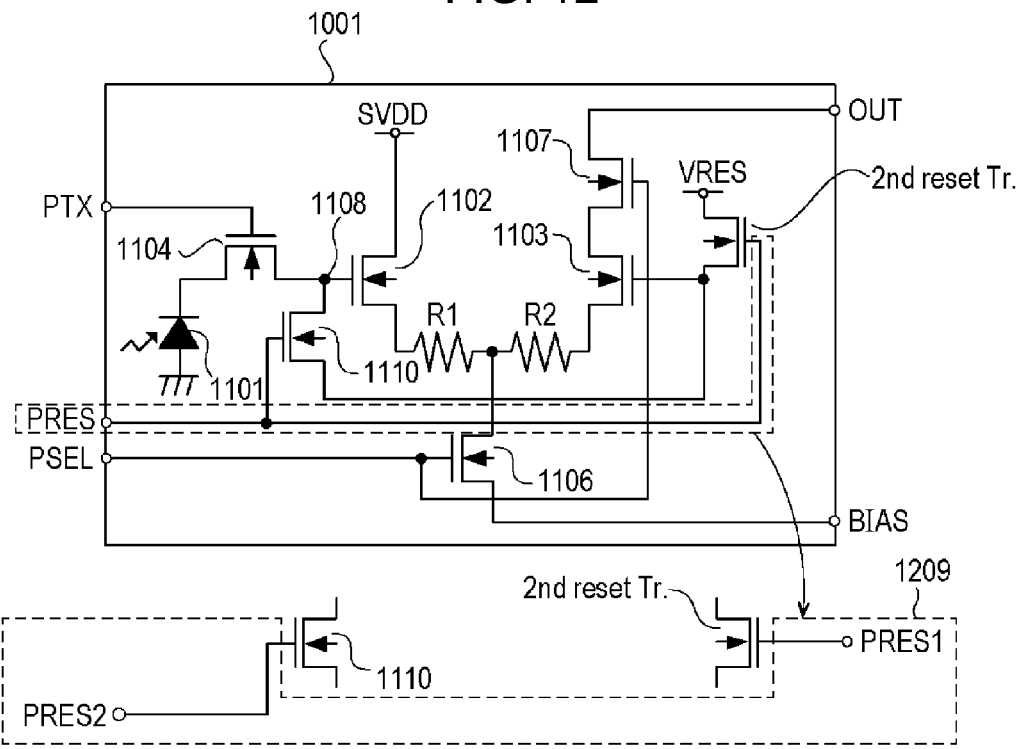
FIG. 12 illustrates an equivalent circuit of an exemplary pixel of an exemplary embodiment.

Other exemplary structure of the pixel 1001 will be described in detail. FIG. 12 illustrates an equivalent circuit of the pixel 1001 according to one or more embodiments. The reset transistor 1109 in FIG. 11 is omitted in FIG. 12. Two transistors (the transfer transistor 1104 and the connection transistor 1110) are connected to the gate of the first input transistor 1102. Two transistors (the second reset transistor and the connection transistor 1110) are connected to the gate of the second input transistor 1103. Accordingly, since the same number of the transistors is connected to each of the first and second input node of the differential amplifier, the accuracy of the current signal may be improved. In addition, as in FIG. 11, the gates of the transistor 1110 and the second reset transistor are shown tied together in a dotted enclosure. In another embodiment, the gates of these two transistors may be independently controlled by PRES1 and PRES2 as shown in a dotted enclosure 1209.

In FIGS. 11 and 12, the first and second selection transistors 1106, 1107 are provided for selection of the pixel. Providing the first selection transistor 1106 may reduce power consumption by cutting the current when the pixel is in a non-selective state. Providing the second selection transistor 1107 may reduce the parasitic capacitance of the first output line 1004.

One of the first and second selection transistors 1106, 1107 may be omitted. In case the second selection transistor 1107 is omitted, the accuracy of the current signal may be improved because the symmetrical characteristic of the two input nodes of the differential amplifier may be improved.

Further, a third selection transistor may be provided in an electrical path between the drain of the first input transistor 1102 and the power source line. In case both of the second and third selection transistors are provided, accuracy of the current signal may be improved because the symmetrical characteristic of the differential amplifier may be improved.

In another case, both of the first and second selection transistors 1106, 1107 may be omitted. In this case, the pixel 1001 may be set in non-selective state by providing the gate of the first and second input transistors 1102, 1103 with a voltage such that the both transistors 1102, 1103 are turned off. For example, such voltage may be provided from the reset voltage line. In case both of the first and second selection transistors 1106, 1107 are omitted, the fill factor of the pixel may be improved by reduction of the number of the pixel transistors.

Further, the pixel configuration in FIG. 11 may change such that a charge of the PD 1101 may be transferred to the gate of the second input transistor 1103. In other words, the transfer transistor may be provided not in an electrical path between the PD 1101 and the gate of the first input transistor 1102, but in an electrical path between the PD 1101 and the gate of the second input transistor 1103. In this case, since the same number of the transistors is connected to each of the first and second input node of the differential amplifier, the accuracy of the current signal may be improved. Each gate of the first and second input transistors 1102, 1103 may be set in an electrically floating state after the reset voltage VRES is provided. Accordingly, the current signal corresponding to the difference of the voltages between the two input nodes may be output regardless of which one of the two input node the charge of the PD 1101 is transferred to.

In FIGS. 11 and 12, the connection transistor 1110 is connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 10, in one or more embodiments, the circuit for reading out the current signal corresponding to the amount of charges generated in the photoelectric conversion unit into the first output line 1004, which is illustrated in each of FIGS. 11 and 12, is repeatedly or periodically arranged. That is, the circuit illustrated in any one of FIGS. 11 and 12 is provided each of the plurality of the photoelectric conversion units. In other words, transistors included in the readout portion are repeatedly, or periodically, arranged so as to corresponding to a plurality of the pixels whose signals are output to the common output line (the first output line 1004).

In other embodiments, the circuit illustrated in any one of FIGS. 11 and 12 may be repeatedly, or periodically, provided for every two or more of the plurality of the photoelectric conversion units. In detail, charges of two photoelectric conversion units may be transferred into the gate of the first input transistor 1102, which is commonly provided for the two photoelectric conversion units. In this case, a plurality of the photoelectric conversion units may share the transistors other than the transfer transistor. Therefore the fill factor of the pixel may be improved by reduction of the number of the pixel transistors.

In the present embodiment, the transistors each of which is repeatedly, or periodically, provided so as to correspond to the plurality of the photoelectric conversion units may have the same conductivity type. Specifically, the first and second input transistors 1102, 1103, the transfer transistor 1104, the first and second selection transistors 1106, 1107, the reset transistor 1109 and the connection transistor 1110 are respectively N-type channel MOS transistors. In this case, since a single conductivity type of a well may be provided in the pixel 1001, the fill factor of the pixel, which is a ratio of a region that the photoelectric conversion unit occupies to a region of a single pixel, may be improved. Therefore, sensitivity and/or a saturation amount of charges may be improved. However, a part of these transistors may have a different conductivity type from the others.

In the present embodiment, the electron may be used as the signal charge, and the N-type channel transistors may be provided in the pixel. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is not repeatedly arranged but is provided commonly for a plurality of the photoelectric conversion units may be included in the circuit for reading out the current signal corresponding to the amount of charges generated in the photoelectric conversion unit into the first output line 1004. For example, the bias current source 1002 in FIG. 10 may be included in the circuit for reading out, or the readout portion, because it may drive the differential amplifier by providing the bias current. In FIG. 10, the bias current source 1002, however, is provided for each of the plurality of the pixel rows. Thus, the bias current source 1002 is not an element which is repeatedly, or periodically, arranged so as to correspond to the plurality of the photoelectric conversion units whose signals are to be output to the common output line (the first output line 1004). Thus, the bias current source 1002 may include a P-type channel transistor.

Figure 16:
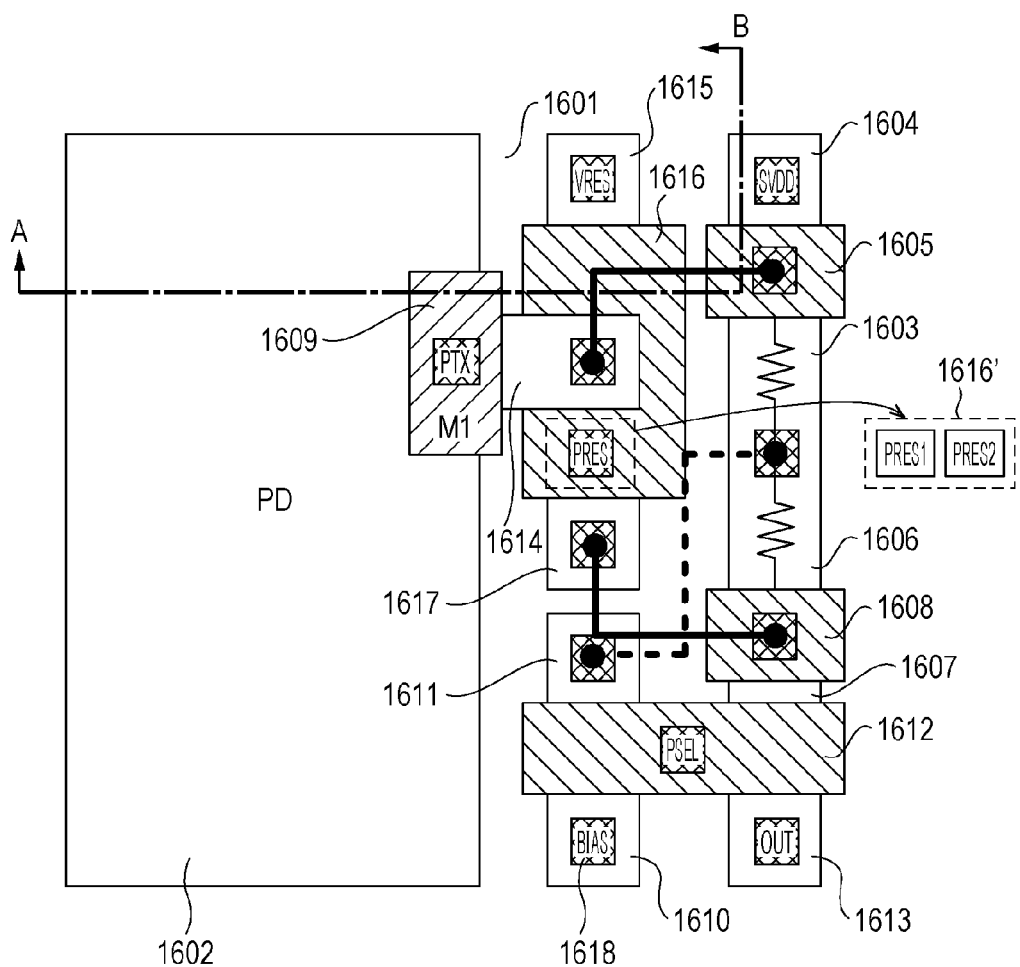
FIG. 16 is a schematic illustration of the planar structure of an exemplary pixel of an exemplary embodiment.

FIG. 16 is a schematic illustration of the planar structure of the pixel illustrated in FIG. 11. The pixel circuit may be provided in a semiconductor substrate, such as a silicon substrate or the like. The semiconductor substrate includes an active region, which is defined by an element isolation portion 1601. Elements, such as photodiodes, transistors and resistors, may be provided in the active region.

The element isolation portion 1601 may include an isolation structure such as LOCOS (Local Oxidation of Silicon) or STI (Shallow Trench Isolation). In another case, the element isolation portion 1601 may include an isolation structure using a PN junction. The element isolation portion 1601 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 1101 includes a semiconductor region 1602. The first input transistor 1102 may include semiconductor regions 1603, 1604 and a gate electrode 1605 as the source, the drain and the gate. The second input transistor 1103 may include semiconductor regions 1606, 1607 and a gate electrode 1608 as the source, the drain and the gate, respectively. The semiconductor regions 1603 and 1606 may respectively form the resistors R1 and R2. The transfer transistor 1104 may include a gate electrode 1609 as the gate. The first selection transistor 1106 may include semiconductor regions 1610, 1611 and a gate electrode 1612 as the source, the drain and the gate. The second selection transistor 1107 may include semiconductor regions 1607, 1613 and the gate electrode 1612 as the source, the drain and the gate, respectively. The reset transistor 1109 may include semiconductor regions 1614, 1615 and a gate electrode 1616 as the source, the drain and the gate, respectively. The connection transistor 1110 may include the semiconductor regions 1614, 1617 and the gate electrode 1616 as the source, the drain and the gate, respectively.

Contact plugs 1618 are provided for the gate electrode and the semiconductor regions each of which forms the source or the drain. The semiconductor regions and the gate electrode may be connected to conductive members included in interconnections via the contact plugs 1618. For example, the semiconductor region 1614 and the gate electrode 1605 are connected to each other by the interconnection, and form the node 1108 in FIG. 11.

As shown in FIG. 16, two nodes, which are supposed to be electrically connected to each other, may be formed of a common semiconductor region or a common gate electrode. For example, since the drain of the second input transistor 1103 may be connected to the source of the second selection transistor 1107, both nodes are formed of the semiconductor region 1607. In another case, however, the two nodes may be formed of two separated semiconductor regions. The gate of the reset transistor 1109 and the gate of the connection transistor 1110 may be formed of two separated gate electrodes to correspond to two reset control signals PRES1 and PRES2 as shown in a dotted enclosure 1616'. Although, in FIG. 16, the resistors R1 and R2 are formed of the semiconductor regions 1603 and 1606, the resistors R1 and R2 may be thin film resistors formed of poly-silicon as the like.

As shown in FIG. 16, the structure from the gate electrode 1605 to the gate electrode 1608 may have symmetry with respect to a line. In this case, the accuracy of the current signal may be improved because the symmetrical characteristic of the differential amplifier may be improved.

Figure 17:
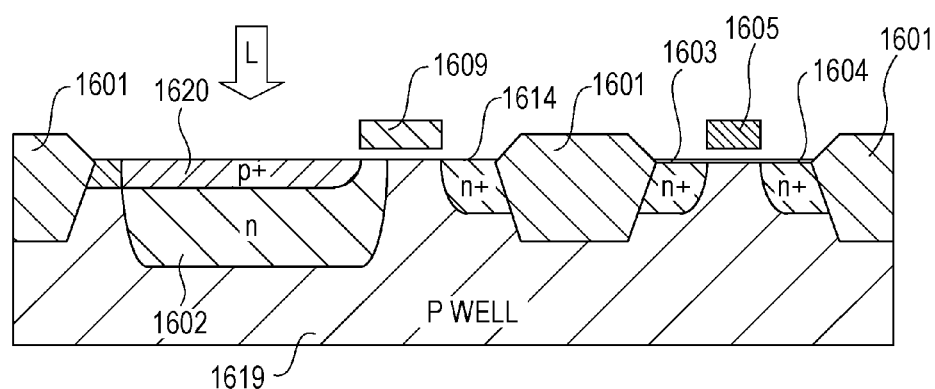
FIG. 17 is a schematic illustration of the cross-sectional structure of an exemplary pixel of an exemplary embodiment.

FIG. 17 is a schematic illustration of an exemplary cross-sectional structure taken along a line A-B in FIG. 16. The PD 1101, the transfer transistor 1104 and the first input transistor 1102 are exemplarily illustrated in FIG. 17. The same reference symbol is used to indicate elements in FIG. 17 and FIG. 16 which perform the same or a similar function, and detailed descriptions of the elements are not repeated.

The PD 1101 includes an N-type semiconductor region 1602. The N-type semiconductor region 1602 may accumulate generated charges therein. The first input transistor 1102 may include N-type semiconductor regions 1603 and 1604 as the source and the drain. Accordingly, the first input transistor 1102 may have an N-type channel. These N-type semiconductor regions may be provided in a P-type well 1619. The P-type well 1619 may be provided with the ground voltage GND.

The P-type well 1619 may be a semiconductor region formed by diffusing or implanting impurities into the semiconductor substrate. In another case, the P-type well 1619 may be formed by an epitaxial layer grown on the semiconductor substrate.

A P-type semiconductor region 1620 is provided adjacent to the N-type semiconductor region 1602 of the PD 1101. The P-type semiconductor region 1620 may be connected to the P-type well 1619 and be provided with the ground voltage GND. The P-type semiconductor region 1620 may reduce a noise caused by a dark current generated at the interface of the semiconductor substrate and an insulator.

In case the transistors which included in the pixel circuit have the same conductivity type, a single conductivity type of a well may be used in the pixel as shown in FIG. 17. Therefore, the fill factor of the pixel, which is a ratio of a region that the photoelectric conversion unit occupies to a region of a single pixel, may be improved.

In the present embodiment, the PD 1101 which accumulates the electron may be formed by providing N-type semiconductor region 1602 in the P-type well 1619. In this case, since the photoelectric conversion unit and the transistors may be provided in the same well, the fill factor of the pixel may be improved. Therefore, sensitivity and/or a saturation amount of charges may be improved. When hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 17, light may enter the semiconductor substrate in a direction indicated by L. That is, the photoelectric conversion device illustrated in FIG. 17 is a front-side illuminated type.

Figure 18:
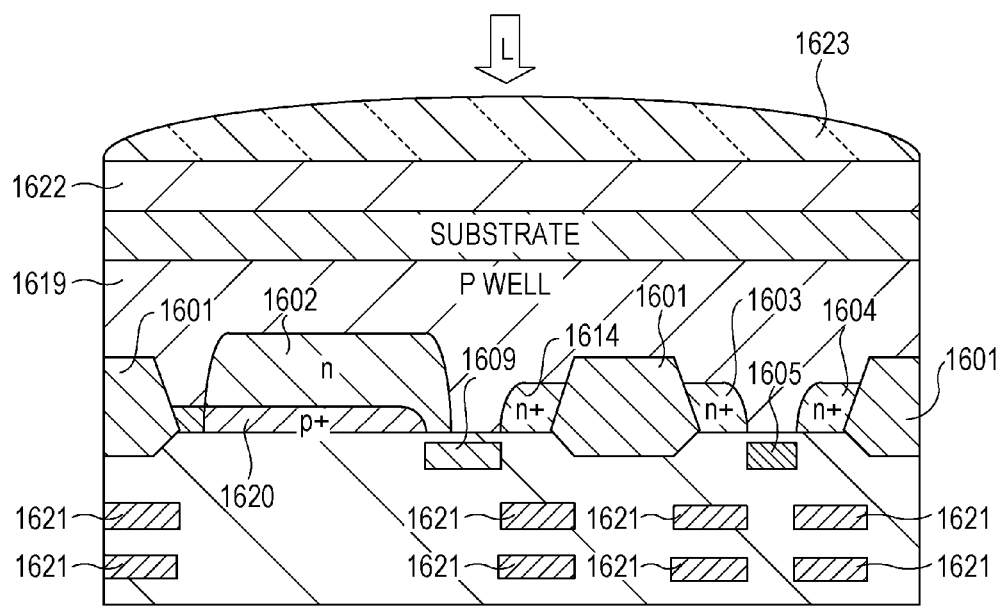
FIG. 18 is a schematic illustration of the cross-sectional structure of an exemplary pixel of an exemplary embodiment.

FIG. 18 is a schematic illustration of another exemplary cross-sectional structure taken along a line A-B in FIG. 16. The PD 1101, the transfer transistor 1104 and the first input transistor 1102 are exemplarily illustrated in FIG. 18.

The photoelectric conversion device illustrated in FIG. 18 is a back-side illuminated type. In detail, light may enter the semiconductor substrate from a side (back side) opposite to a side (front side) on which the gate electrodes of the transistors are provided. The reference symbol L in FIG. 18 indicates a direction in which light may enter the semiconductor substrate.

The same reference symbols are used to indicate elements in FIG. 18 and FIG. 17 which perform the same or a similar function, and detailed descriptions of the elements are not repeated. A conductive member 1621 included in an interconnection is shown in FIG. 18. Further, a color filter 1622 and a lens 1623 may be provided on the back side of the semiconductor substrate.

In the back-side illuminated type photoelectric conversion device, conductive members and gate electrodes, which may shield incident light, may be reduced on a side (back side) though which the incident light may enter the semiconductor substrate. Accordingly, the sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 1621, the first side being opposite to a second side of the conductive member 1621 on which the PD 1101 is provided. In another aspect of view, the (first) semiconductor substrate where the PD 1101 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 1101.

Figure 13:
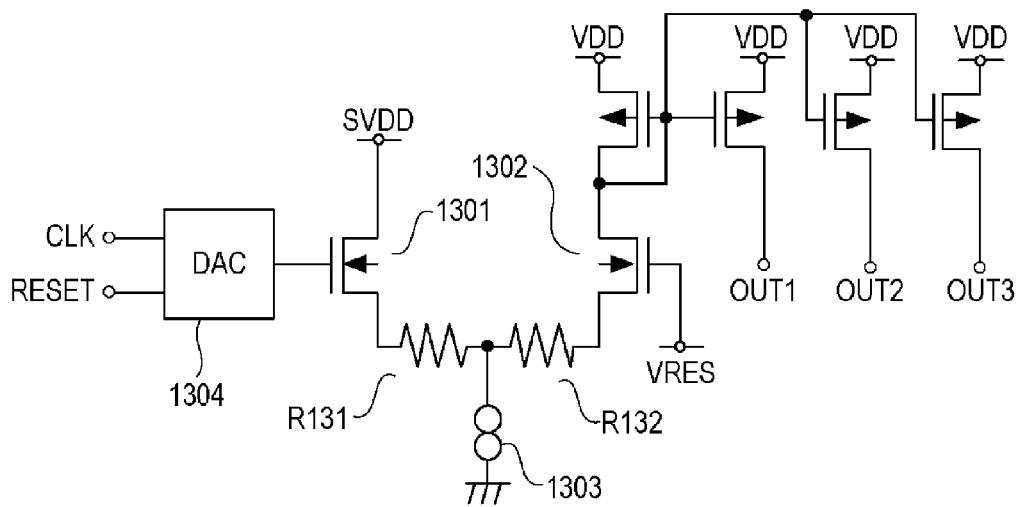
FIG. 13 illustrates an equivalent circuit of an exemplary ramp current signal source of an exemplary embodiment.

Hereinafter, an exemplary structure of the ramp current signal source 1009 will be described in detail. FIG. 13 illustrates an equivalent circuit of the ramp current signal source 1009 according to one or more embodiments. The ramp current signal source 1009 may include a current output circuit and a current mirror circuit. The current output circuit may output a current corresponding to an input voltage. The current mirror may dispense the current from the current output circuit to a plurality of the comparators 1008.

The current output circuit included in the ramp current signal source 1009 of the present embodiment may be a differential amplifier. The differential amplifier of the ramp current signal source 1009 may include a third input transistor 1301 and a fourth input transistor 1302. The third input transistor 1301 and the fourth input transistor 1302 may form a differential pair. The sources of the third and fourth input transistors 1301 and 1302 are electrically connected to a bias current source 1303 respectively via resistors R131 and R132. The drain of the third input transistor 1301 may be provided with the power source voltage SVDD. The drain of the fourth input transistor 1302 is electrically connected to the current mirror circuit of the ramp current signal source 1009.

The gate of the third input transistor 1301 is electrically connected to a DAC (Digital to Analog Convertor) 1304. The DAC 1304 outputs a voltage signal, whose amplitude may vary step-by-step according to a clock signal CLK. According to the drive signal RESET provided for the DAC 1304, the voltage signal is reset to an initial value. The gate of the second input transistor 1302 is provided with the reset voltage VRES.

The drain current of the second input transistor 1302 may vary on the basis of the voltage signal the DAC 1304 outputs. The drain current of the second input transistor 1302 may be the ramp current signal.

The current mirror circuit of the ramp current signal source 1009 mirrors the drain current of the second input transistor 1302 and input mirrored currents to the plurality of the comparators 1008. An OUT1 node is electrically connected to the reference current input node 1011 of the comparator 1008 provided for the leftward column in FIG. 10. An OUT2 node is electrically connected to the reference current input node 1011 of the comparator 1008 provided for the middle column in FIG. 10. An OUTS node is electrically connected to the reference current input node 1011 of the comparator 1008 provided for the rightward column in FIG. 10. The number of output-side transistors of the current mirror circuit of the ramp current signal source 1009 may correspond to the number of the comparators 1008. In another case, the ramp current signal source 1009 may be provided for each of the plurality of the comparators 1008. In this case, the current mirror circuit for dispensing the ramp current signals may be omitted.

The current output circuit included in the ramp current signal source 1009 may have the same structure as, or a similar structure to the pixel amplification unit. In the present embodiment, the same differential amplifier is used for the ramp current signal source 1009. Further, the ramp current signal source 1009 may include a dummy transistor, which may correspond to the pixel transistor such as the reset transistor, the selection transistor or the connection transistor. In detail, the ramp current signal source 1009 may be a circuit which substitutes the DAC 1304 for the PD 1101 of the circuit illustrated in any one of FIGS. 11 and 12. In the case where the current output circuit included in the ramp current signal source 1009 has the same structure as, or a similar structure to the pixel amplification unit, the linearity in analog to digital conversion may be improved.

In another exemplary ramp current signal source 1009, a voltage source including a constant current source and a capacitor may substitute for DAC 1304. Since the constant current source is configured to charge the capacitor by a constant current, a voltage signal, whose amplitude may be continuously variable, may emerge at the capacitor. Accordingly, the ramp current signal source 1009 outputs the ramp current signal, whose amplitude may be continuously variable.

The direction in which the ramp current signal varies, i.e., upward or downward, may be determined in accordance with the conductivity type of the signal charge and the conductivity type of the input transistors 1102, 1103. The amplitude of the ramp current signal may vary in a direction from amplitude of the current signal that the pixel 1001 outputs in a dark situation to amplitude of the current signal that the pixel 1001 outputs in a bright situation. The dark situation may include a situation where the voltage of the node 1108 has been reset and charges are not transferred to the node 1108.

In FIGS. 11 and 12, the electron is used as the signal charge, and is transferred to the node 1108, which is the gate of the first input transistor 1102. The transfer of the electron may lower the voltage of the node 1108. The more the charges are transferred, the lower the voltage of the node 1108 may become. Since, in the bright situation, a large amount of charges may be transferred to the node 1108, the voltage of the node 1108 may be low. Since the input transistors 1102, 1103 have N-type channels, the amplitude of the current signal may be larger in the bright situation than in the dark situation. In this case, the ramp current signal whose amplitude varies from small to large (or upward) may be used.

In another case, the electron of the PD 1101 may be transferred to the gate of the second input transistor 1103. In this case, the more the charges are transferred, the smaller the amplitude of the current signal may become. Thus, the ramp current signal whose amplitude varies from large to small (or downward) may be used.

In the case where the hole is used as the signal charge, the above mentioned direction in which the amplitude of the ramp current signal varies may be inverted. Further, the case where the input transistors 1102, 1103 have P-type channels, the above mentioned direction in which the amplitude of the ramp current signal varies may be inverted.

Figure 14:
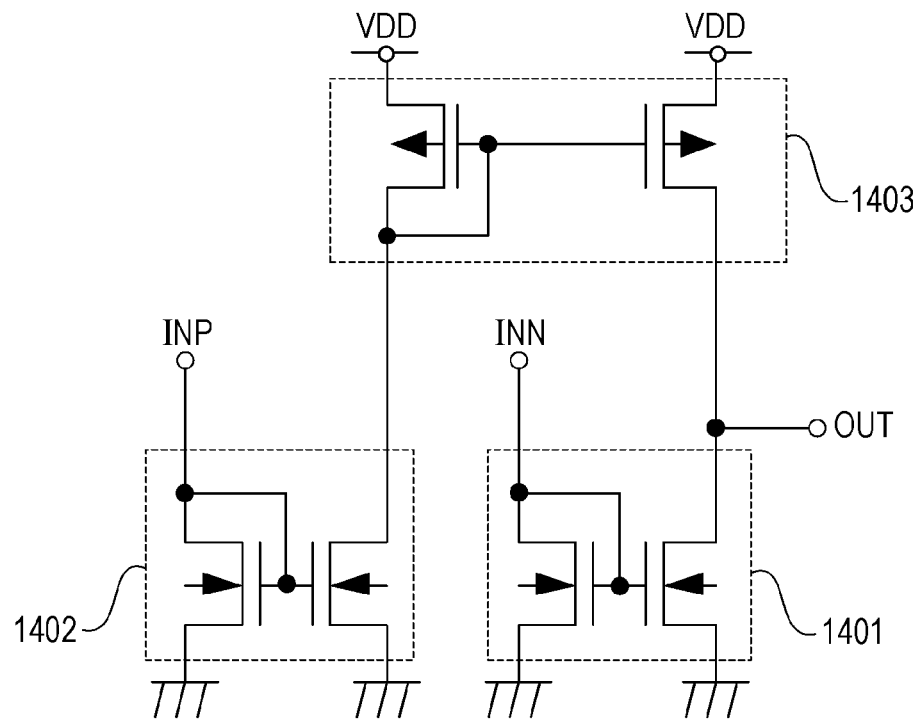
FIG. 14 illustrates an equivalent circuit of an exemplary comparator of an exemplary embodiment.

Hereinafter, an exemplary structure of the comparator 1008 will be described in detail. FIG. 14 illustrates an equivalent circuit of the comparator 1008 according to one or more embodiments. The comparator 1008 may transmit the current signal input to the signal input node 1010 and the reference current signal input to the reference current input node 1011 to the output node 1012. According to the amplitude relationship of the current signals, the comparator 1008 may vary the voltage of the output node 1012.

In FIG. 14, an INN node corresponds to the signal input node 1010. An INP node corresponds to the reference current input node 1011. An OUT node corresponds to the output node 1012.

When a current is input to the INN node, the current may be transmitted to the OUT node via a first current mirror circuit 1401. When a current is input to the INP node, the current may be transmitted to the OUT node via a second current mirror circuit 1402 and a third current mirror circuit 1403.

The OUT node is electrically connected to a ground voltage line via an output-side transistor of the first current mirror circuit 1401. Further, the OUT node is electrically connected to a power source voltage line via an output-side transistor of the third current mirror circuit 1403.

The current input via the INN node (the current signal from the pixel 1001) may discharge the OUT node. On the other hand, the current input via the INP node (the ramp current signal) may charge up the OUT node.

When the current signal from the pixel 1001 is larger than the ramp current signal, the voltage of the OUT node may be or get closer to the ground voltage GND (a first voltage). When the ramp current signal is larger than the current signal from the pixel 1001, the voltage of the OUT node may be or get closer to the power source voltage VDD (a second voltage).

The current signals are transmitted to the OUT node via the current mirror circuits 1401, 1402 and 1403. Since the OUT node has two transistors connected thereto, the capacitance of the OUT node may be reduced. Therefore, when the amplitude relationship of the current signal from the pixel 1001 and the ramp current signal is inverted, the voltage of the output node (the OUT node) of the comparator 1008 may quickly change. Thus, the speed in analog to digital conversion may be improved.

In FIG. 14, each of the current input via the INN node and the current input via the INP node is transmitted to the OUT node via the current mirror circuit. In this case, the two transistors, which connected to the OUT node, may be arranged to be close to each other. Accordingly, a short wire may be used for the OUT node. Thus, the capacitance of the OUT node may be reduced.

Figure 15:
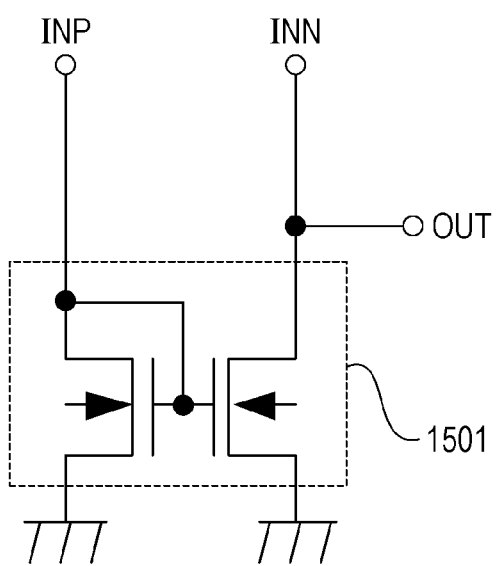
FIG. 15 illustrates an equivalent circuit of an exemplary comparator of an exemplary embodiment.

Hereinafter, another exemplary structure of the comparator 1008 will be described in detail. FIG. 15 illustrates an equivalent circuit of the comparator 1008 according to one or more embodiments. In FIG. 15, an INN node corresponds to the signal input node 1010. An INP node corresponds to the reference current input node 1011. An OUT node corresponds to the output node 1012.

The INN node may be the OUT node. Thus, the voltage of the second output line 1007 which is electrically connected to the INN node may vary according to the amplitude relationship of the current signals.

Although the first output line 1004 is electrically connected to the plurality of the pixels 1001, the second output line 1007 is electrically connected to the first output line 1004 via the current mirror circuit. Accordingly, only the output-side transistor 1006 of the current mirror circuit may be connected to the second output line 1007. Thus, even in the case where the second output line 1007 and the output node 1012 are the same node, speed in analog to digital conversion may be improved.

The current input to the INP node may be transmitted to the OUT node via only the first current mirror circuit 1501. Thus, the A-D convertor may be reduced in scale.

In the comparator 1008 illustrated in FIG. 15, the current input via the INN node (the current signal from the pixel 1001) may charge up the OUT node. On the other hand, the current input via the INP node (the ramp current signal) may discharge the OUT node.

When the current signal from the pixel 1001 is larger than the ramp current signal, the voltage of the OUT node may be or get closer to power source voltage VDD (a first voltage). When the ramp current signal is larger than the current signal from the pixel 1001, the voltage of the OUT node may be or get closer to the ground voltage GND (a second voltage).

Figure 19:
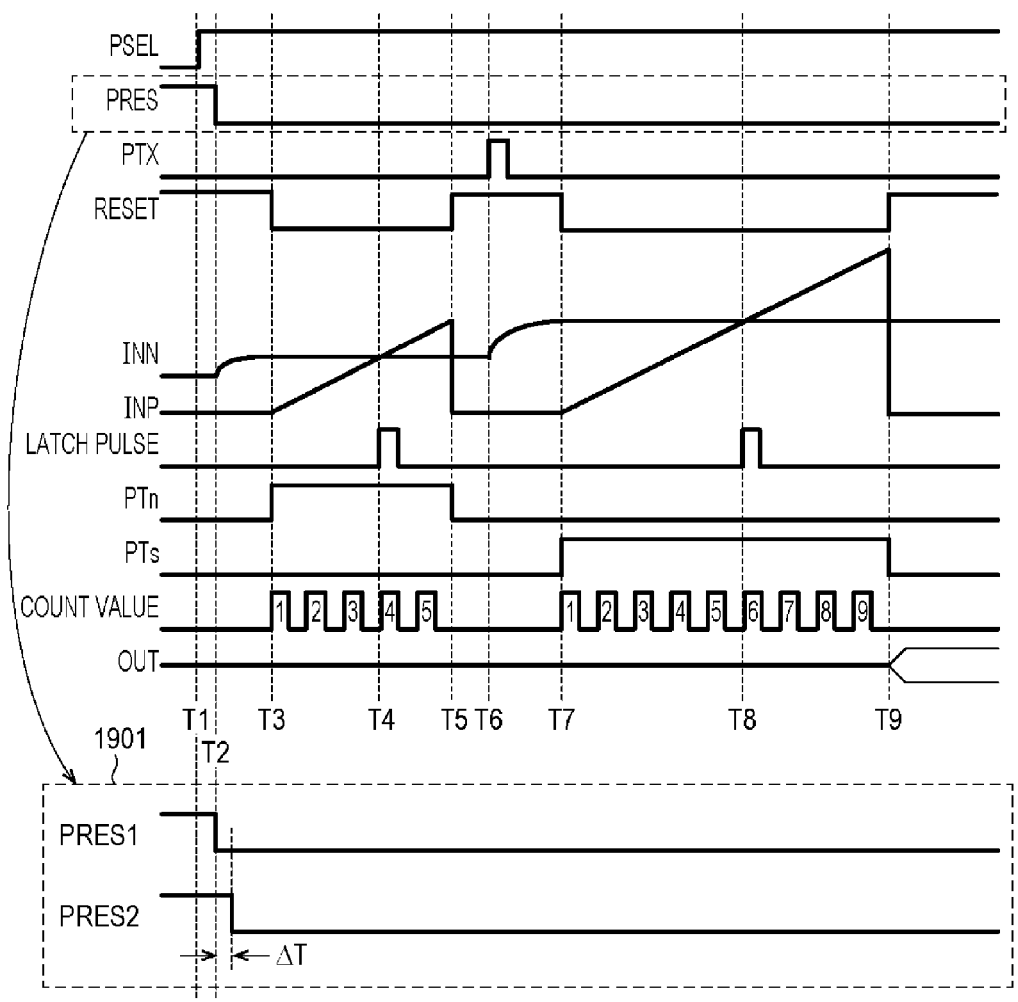
FIG. 19 is a timing chart of an exemplary operation for an exemplary embodiment.

Hereinafter, an exemplary operation for the photoelectric conversion device according to one or more embodiments will be described. FIG. 19 is a timing chart of the drive signals. The drive signals PSEL, PRES, PTX, PTN and PTS, illustrated in FIG. 19, are respectively provided for the PSEL node, the PRES node, the PTX node, the PTN node and the PTS node, illustrated in FIG. 10.

The drive signal RESET represents the ramp reset signal, which is provided for the RESET node of the ramp current signal source 1009, and the counter reset signal, which is provided for the RESET node of the counter 1016. Since the ramp reset signal and the counter reset signal may synchronize with each other, the drive signal RESET in FIG. 19 represents both of the two signals. In another case, provided may be the ramp reset signal and the counter reset signal, which are not synchronized.

FIG. 19 illustrates the current signal INN, which is input to the signal input node 1010 (INN node) of the comparator 1008, and the ramp current signal INP, which is input to the reference current input node 1011 (INP node) of the comparator 1008. Further, FIG. 19 illustrates the latch pulse that the patch pulse generator 1013 outputs and the count value that the counter 1016 outputs.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES and RESET are of high levels. In another embodiment where there are two independent reset control signals PRES1 and PRES2 as shown in a dotted enclosure 1901, both the PRES1 and PRES2 are of high levels. The other drive signals are of low levels. At this time, the reset voltage VRES is provided for the node 1108 and the gate of the second input transistor 1103. Since the drive signal RESET is a high level, each of the ramp current signal source 1009 and the counter 1016 is in a state of being reset, or of outputting the initial value.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 1108 may become electrically floating. In another embodiment where there are two independent reset control signals PRES1 and PRES2, as shown in FIG. 11, the PRES1 signal turns into a low level first. After a time interval ΔT, the PRES2 signal turns into a low level. In the pixel illustrated in FIG. 11, the node 1108 and the gate of the second input transistor 1103 may become electrically floating.

At T3, the RESET turns into a low level, and the PTN turns into a high level. With the RESET's turning into the low level, the amplitude of the ramp current signal may start to change from the initial value. In the present embodiment, the amplitude of the ramp current signal may change upward. Further, the counter 1016 may start to count at this time.

At T3, the voltage of the input node (node 1108) of the pixel amplification unit is the reset voltage VRES. Accordingly, a current signal that the pixel outputs when in a state of being reset is compared with the ramp current signal. The current signal that the pixel outputs when in a state of being reset may contain a reset nose, which is generated when the reset transistor turns off.

At the inversion of the amplitude relationship between the ramp current signal and the current signal from the pixel (at T4), the latch pulse is input to the N latch circuit 1014, whereby the N latch circuit 1014 may store the count value at T4.

At T5, the RESET turns into a high level, whereby the ramp current signal source 1009 and the counter 1016 are reset. Then, the PTN turns into a low level.

At T6, the PTX turns into a high level, whereby the charge generated at PD 1101 may be transferred to the node 1108. At this time, the whole charges of the PD 1101 may be transferred to the node 1108. After a period passes since T6, the PTX turns into a low level.

By the transfer of the charges to the node 1108, the voltage of the node 1108 may change from the reset voltage VRES. The amount of the voltage change may be defined by the amount of the charges transferred. On the other hand, the voltage of the gate of the second input transistor 1103 may be kept at the reset voltage VRES. Thus, the voltage difference according to the amount of the charges may emerge between the two input nodes of the differential amplifier, and the differential amplifier may output the current signal according to the voltage difference.

At T7, the RESET turns into a low level, and the PTN turns into a high level. With the RESET's turning into the low level, the amplitude of the ramp current signal may start to change from the initial value. Further, the counter 1016 may start to count at this time. Since the PTN is the high level, the count value from the counter 1016 is input to the S latch circuit 1015.

At T7, the voltage of the input node (node 1108) of the pixel amplification unit is a voltage corresponding to the amount of the charges generated by the incident light. Accordingly, a current signal corresponding to the amount of the incident light is compared with the ramp current signal. The current signal corresponding to the amount of the incident light may contain a reset nose, which is generated when the reset transistor turns off.

At the inversion of the amplitude relationship between the ramp current signal and the current signal from the pixel (at T8), the latch pulse is input to the S latch circuit 1015, whereby the S latch circuit 1015 may store the count value at T8.

At T9, the RESET turns into a high level, and then the analog to digital conversion may be accomplished. From T9, the output portion may start to output the digital signals.

In the pixel corresponding to FIG. 11, a timing of turning off the reset transistor 1109 and a timing of turning off the connection transistor 1110 may be offset. In detail, the reset transistor 1109 turns off before the connection transistor 1110 turns off. This is illustrated by the timing shown in the enclosure 1901 in FIG. 19. By this order of the operation, the reset noises, which is generated when the reset transistor 1109 turns off, may be substantially equally divided into the two input nodes. As the result, since the divided noises may cancel each other by the differential amplification, noises in the current signal may be reduced.

The read out of the current signal that the pixel outputs when in a state of being reset may be omitted. Even though the read out of the current signal that the pixel outputs when in a state of being reset is omitted, an offset noise of the pixel and the reset noise may be reduced because the pixel amplification unit is the differential amplifier. However, with the read out of the current signal that the pixel outputs when in a state of being reset, offset noises generated in the subsequent states of the pixel may be reduced.

Hereinafter, another exemplary operation for the photoelectric conversion device according to one or more embodiments will be described. In this operation, the drive signal PSEL may be provided parallel for the pixels in a plurality of the pixel rows. Thus, the pixels in the plurality of the pixel rows may simultaneously output the current signals to the same first output line 1004. According to this way of operation, the current signals may be summed up or averaged at the first output line 1004. In this case, each of the drive signals PSEL, PRES, PTX may be provided for the pixels in the plurality of the pixel rows simultaneously.

For addition of two current signals from two pixels, the bias current source 1002 may output the bias current which has the amplitude twice as large as that of the bias current the bias current source 1002 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

The current signal from the pixel may be amplified or attenuated in the analog to digital conversion by controlling the amplification factor of the current mirror circuit of the ramp current signal source 1009. In the case where two current signals are added, for example, the amplification factor may be set in two.

As described above, the pixel includes the differential amplifier. And, the transistors included in pixel have the same conductivity type. Thus, in one or more embodiments, sensitivity may be improved.

As described above, in the present embodiment, the current signal from the pixel is mirrored by the current mirror circuit, and the mirrored signal is compared with the ramp current signal. According to the embodiment, it may be possible to compare the current signal from each of the signal sources with the reference current signal even though those signal sources are not connected to the comparator, especially the output node of the comparator. It may be possible to reduce the parasitic capacitance of the output node, where a voltage signal representing a result of the comparison may be output. Hence, the comparison of the current signals may be conducted in a short time.

In the present embodiment, the A-D convertor is provided for each pixel column. In the A-D convertor, the voltage of the output node may change from the first voltage to the second voltage (or otherwise) when the amplitude relationship of the current signal from the pixel and the ramp current signal is inverted. In other words, the voltage of the output node may be inverted. If it takes long to invert the voltage of the output node since the inversion of the amplitude relationship, the generation of the latch pulse may be delayed. Since the counter may continue to count up because of the delay of the latch pulse, the latch circuit may store a wrong count value. For prevention the above mentioned error, a clock signal of a low frequency may be used, which results in a deterioration in the speed of the analog to digital conversion.

On the contrary, in the present embodiment, since the parasitic capacitance of the output node may be reduced, the voltage of the output node may be quickly inverted. As a result, the above mentioned error may be reduced when a clock signal of a high frequency is used. Hence, speed of the analog to digital conversion may be improved.

Fourth Exemplary Embodiment

Figure 20:
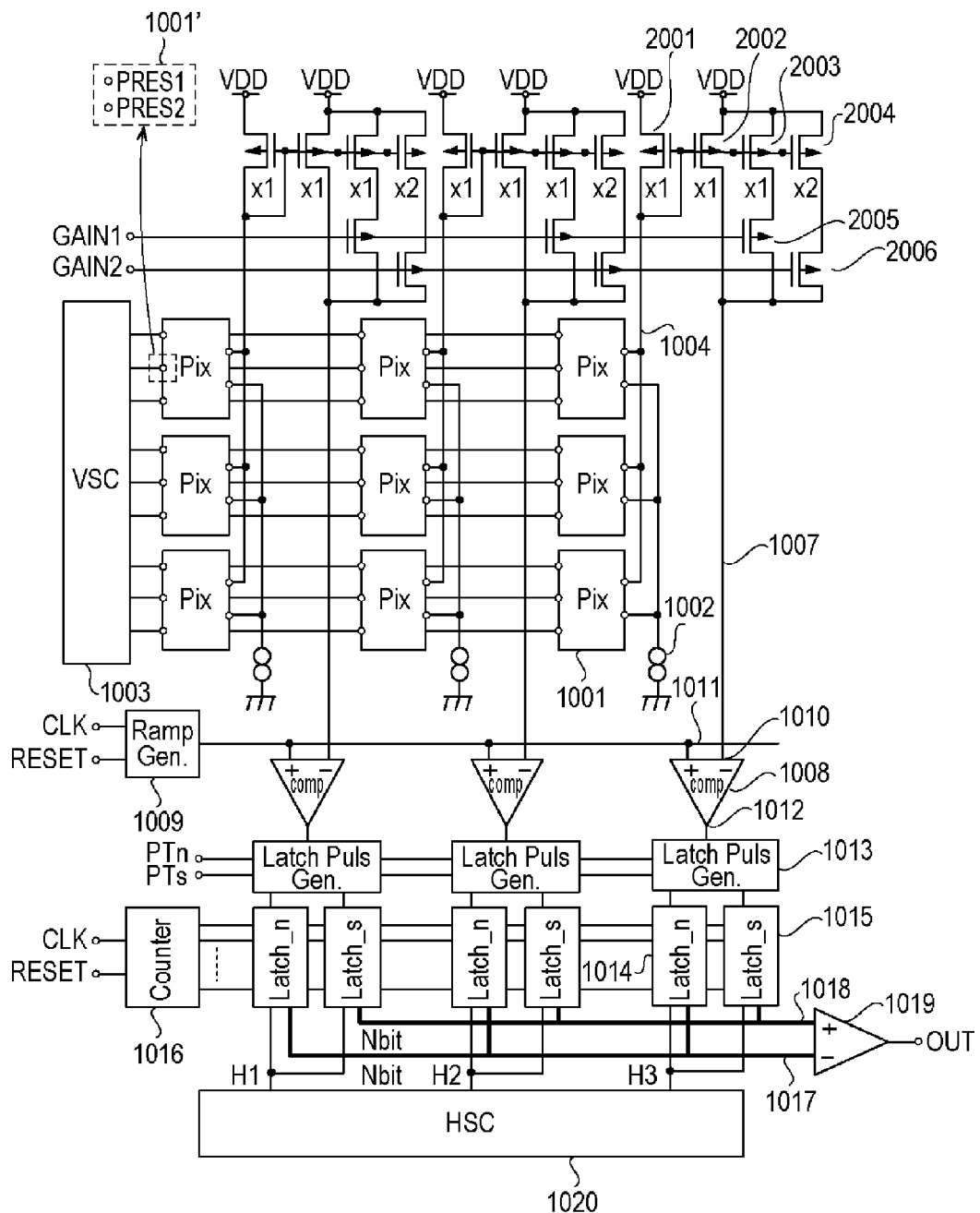
FIG. 20 illustrates an equivalent circuit of a fourth exemplary embodiment.

FIG. 20 illustrates an equivalent circuit of a photoelectric conversion device according to one or more embodiments. The same reference symbol is used to indicate elements in FIG. 20 and FIG. 10 which perform the same or a similar function, and detailed descriptions of the elements are not repeated. In addition, similar to FIG. 1, the PRES node is shown in a dotted enclosure to indicate that there is another alternative embodiment shown in a dotted enclosure 1001' which has two nodes: PRES1 and PRES2 that correspond to two reset control signals.

The photoelectric conversion device of the present embodiment includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which is output from the pixel as an analog signal, into a digital signal. According to drive signals the horizontal scanning circuit provides, the digital signal is read out to the output portion. The output portion outputs the digital signal to the outside of the device.

In the present embodiment, the amplification factor of the current mirror circuit is controllable. The other features may be the same as the above described embodiment. The detailed explanation of the same features as the above described embodiment is not repeated.

The current mirror circuit includes an input-side transistor 2001 and three output-side transistors 2002, 2003 and 2004. The input and output-side transistors 2001, 2002, 2003, 2004 are P-type channel MOS transistors.

The gate and the drain of the input-side transistor 2001 are shorted. The source of the input-side transistor 2001 is electrically connected to a power source line. The power source line may provide the source of the input-side transistor 2001 with a power source voltage VDD. The first output line 1004 is electrically connected to the drain of the input-side transistor 2001 and the gate which is shorted to the drain of the input-side transistor 2001.

The output-side transistors 2002, 2003 and 2004 are arranged in parallel. In detail, the sources of the output-side transistors 2002, 2003 and 2004 are respectively connected to the power source line. The power source line may provide the sources of the output-side transistors 2002, 2003 and 2004 with the power source voltage VDD. The gates of the output-side transistors 2002, 2003 and 2004 are respectively connected to the gate of the input-side transistor 2001. The drains of the output-side transistors 2002, 2003 and 2004 are respectively connected to the second output line 1007.

The input-side transistor 2001 and the first and second output-side transistors have the substantially same channel widths. The third output-side transistor 2004 has twice as a wide channel width as the input-side transistor 2001. The input and output-side transistors 2001, 2002, 2003 and 2004 have the substantially same channel length.

A first gain control switch 2005 is arranged in an electrical path between the drain of the second output-side transistor 2003 and the second output line 1007. The first gain control switch 2005 is a P-type channel MOS transistor. A drive signal GAIN1 may control the first gain control switch 2005 to be turned on or off.

A second gain control switch 2006 is arranged in an electrical path between the drain of the third output-side transistor 2004 and the second output line 1007. The second gain control switch 2006 is a P-type channel MOS transistor. A drive signal GAIN2 may control the second gain control switch 2006 to be turned on or off.

The first and second gain control switches 2005 and 2006 may control the amplification factor of the current mirror circuit. The first and second gain control switches 2005 and 2006 may be included in an amplification factor control portion. By the two gain control switches 2005 and 2006, four of gains are to be set.

When both of the first and second gain control switches 2005 and 2006 are turned off, the second and third output-side transistors 2003 and 2004 are disconnected from the second output line 1007. Accordingly, only the first output-side transistor 2002 of the three may be connected to the second output line 1007. In this case, the mirrored current signal may be output at the amplification factor of about 1.

When the first gain control switch 2005 is turned on and the second gain control switch 2006 is turned off, the third output-side transistors 2004 is disconnected from the second output line 1007. Accordingly, the first and second output-side transistors 2002 and 2003 of the three may be connected to the second output line 1007. Since the output-side transistors are arranged in parallel, a virtual output-side transistor which has twice as a wide channel width as the input-side transistor 2001 may be considered. In this case, the mirrored current signal may be output at the amplification factor of about 2.

When the first gain control switch 2005 is turned off and the second gain control switch 2006 is turned on, the second output-side transistors 2003 is disconnected from the second output line 1007. Accordingly, the first and third output-side transistors 2002 and 2004 of the three may be connected to the second output line 1007. Since the output-side transistors are arranged in parallel, a virtual output-side transistor which has three times as a wide channel width as the input-side transistor 2001 may be considered. In this case, the mirrored current signal may be output at the amplification factor of about 3.

When both of the first and second gain control switches 2005 and 2006 are turned on, all of the three output-side transistors 2002, 2003 and 2004 may be connected to the second output line 1007. Since the output-side transistors are arranged in parallel, a virtual output-side transistor which has four times as a wide channel width as the input-side transistor 2001 may be considered. In this case, the mirrored current signal may be output at the amplification factor of about 4.

As mentioned above, the amplification factor of the current mirror circuit is controllable.

In FIG. 20, three output-side transistors are arranged. However, the number of the output-side transistors is not limited to three. According to the size of each of the transistors, the amplification factor may be determined.

In the case where the current signals from the pixels are individually output, the amplification factor may be changed. For example, the amplification factor may be controlled to be large when the current signal from the pixel has a small amplitude, while being small when the current signal from the pixel has a large amplitude.

The amplification factor may be changed between the case where the current signal from a single pixel is output and the case where the current signals from a plurality of the pixels are simultaneously output. For adding or averaging the current signals, a small amplification factor may be used. The small amplification factor may result in a large dynamic range at the subsequent stages.

An exemplary structure of the pixel may be the same as the above described embodiment. The equivalent circuit of the pixel is illustrated in FIG. 11 or 12. The exemplary planar and cross-sectional structures of the pixel are illustrated in FIGS. 16, 17 and 18.

An exemplary operation for the photoelectric conversion device according to the present embodiment may be the same as the above described embodiment. The photoelectric conversion device may be operated according to the drive signals illustrated in FIG. 19.

In the present embodiment, since the amplification factor of the current mirror circuit is controllable, a wide dynamic range and a high signal-to-noise ratio (SN ratio) may be obtained. For capturing a dark object, the SN ratio may be improved because of a high gain of the current mirror circuit. For capturing a bright object, which is less effected by noises, dynamic range may be improved because of a low gain of the current mirror circuit.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2011-274891 filed Dec. 15, 2011, which is hereby incorporated by reference herein in its entirety.

What is claimed is:

1. A photoelectric conversion device comprising:
a photoelectric conversion unit;
a differential amplifier configured to output a current signal based on an amount of charges generated by the photoelectric conversion unit, wherein the differential amplifier includes a first input transistor and a second input transistor forming a differential pair;
a transfer transistor directly connected to a gate of the first input transistor, and configured to transfer a charge generated by the photoelectric conversion unit to the gate of the first input transistor;
a reset voltage providing unit configured to provide a reset voltage for the gate of the first input transistor and a gate of the second input transistor;
a reset transistor electrically connected to either one of the gate of the first input transistor or the gate of the second input transistor, and configured to control an electrical connection between the reset voltage providing unit and the gate connected to the reset transistor; and
a connection transistor configured to control an electrical connection between the gate of the first input transistor and the gate of the second input transistor, wherein a source of the connection transistor is directly connected to the gate of the first input transistor, and a drain of the connection transistor is directly connected to the gate of the second input transistor.

2. The photoelectric conversion device according to claim 1,
wherein the gate connected to the reset transistor, of the gates of the first and second input transistors, is electrically connected to the reset voltage providing unit via the reset transistor, and
wherein an other one of the gates of the first and second input transistors is electrically connected to the reset voltage providing unit via the reset transistor and the connection transistor.

3. The photoelectric conversion device according to claim 2, further comprising a control unit configured to control the reset transistor and the connection transistor,
wherein the control unit is configured to control both of the reset transistor and the connection transistor to be turned on, thereafter control the reset transistor to be turned off, and thereafter control the connection transistor to be turned off.

4. The photoelectric conversion device according to claim 3,
wherein the differential amplifier is configured to output a first current signal after both of the reset transistor and the connection transistor are turned off,
wherein the transfer transistor is configured to transfer a charge after the output of the first current signal, and
wherein the differential amplifier is configured to output a second current signal after the transfer of the charge.

5. The photoelectric conversion device according to claim 1, wherein the reset transistor is electrically connected to the gate of the second input transistor.

6. The photoelectric conversion device according to claim 1, wherein a number of transistors connected to the gate of the first input transistor is equal to a number of transistors connected to the gate of the second input transistor.

7. The photoelectric conversion device according to claim 1, further comprising:
a second photoelectric conversion unit;
a second differential amplifier; and
an output line electrically connected to the differential amplifier and the second differential amplifier,
wherein the differential amplifier and the second differential amplifier are configured to simultaneously output the current signals to the output line, and
wherein the output line is configured such that the current signals simultaneously output to the output line are summed up at the output line.

8. The photoelectric conversion device according to claim 7, further comprising a bias current source configured to provide each of the differential amplifier and the second differential amplifier with a bias current,
wherein the bias current source is configured to provide a first bias current for either one of the differential amplifier or the second differential amplifier individually outputting the current signal, and to provide a second bias current, having a larger amplitude than that of the first bias current, for both of the differential amplifier and the second differential amplifier simultaneously outputting the current signals.

9. The photoelectric conversion device according to claim 1, further comprising an output line, wherein the first input transistor is electrically connected to the output line.

10. The photoelectric conversion device according to claim 1, further comprising an output line, wherein the second input transistor is electrically connected to the output line.

11. The photoelectric conversion device according to claim 1, further comprising:
a third photoelectric conversion unit; and
a second transfer transistor electrically connected to the gate of the first input transistor, and configured to transfer a charge generated by the third photoelectric conversion unit to the gate of the first input transistor.

12. The photoelectric device according to claim 1, further comprising a first semiconductor substrate,
wherein the photoelectric conversion unit is provided in the first semiconductor substrate,
wherein an interconnection connected to the first or second input transistor is provided on a first surface of the first semiconductor substrate, and
wherein the photoelectric conversion unit is configured to convert incident light from a second surface of the first semiconductor substrate, opposite to the first surface, into a charge.

13. The photoelectric conversion device according to claim 12, further comprising a second semiconductor substrate facing to the first surface of the first semiconductor substrate,
wherein the interconnection is provided between the first and second semiconductor substrates, and
wherein at least one of the first and second input transistors, the reset transistor and the connection transistor is/are provided in the second semiconductor substrate.

14. A photoelectric conversion device comprising:
a first photoelectric conversion unit;
a second photoelectric conversion unit;
a first differential amplifier configured to output a current signal based on an amount of charges generated by the first photoelectric conversion unit, wherein the first differential amplifier includes a first input transistor and a second input transistor forming a first differential pair;
a second differential amplifier configured to output a current signal based on the amount of charges generated by the second photoelectric conversion unit;
wherein the second differential amplifier includes a third input transistor and a fourth input transistor forming a second differential pair;
an output line electrically connected to the first differential amplifier and the second differential amplifier,
a bias current source configured to provide each of the first differential amplifier and the second differential amplifier with a bias current,
a transfer transistor directly connected to an gate of the first input transistor, and configured to transfer a charge generated by the first photoelectric conversion unit to the gate of the first input transistor;
a reset voltage providing unit configured to provide a reset voltage for the gate of the first input transistor and a gate of the second input transistor;
a reset transistor electrically connected to the gate of the second input transistor, and configured to control an electrical connection between the reset voltage providing unit and the gate of the second input transistor; and
a connection transistor configured to control an electrical connection between the gate of the first input transistor and the gate of the second input transistor, wherein a source of the connection transistor is directly connected to the gate of the first input transistor, and a drain of the connection transistor is directly connected to the gate of the second input transistor,
wherein the gate of the second input transistor is electrically connected to the reset voltage providing unit via the reset transistor,
wherein the gate of the first input transistor is electrically connected to the reset voltage providing unit via the reset transistor and the connection transistor,
wherein the first and second differential amplifiers are configured to simultaneously output the current signals to the output line, and
wherein the output line is configured such that the current signals simultaneously output to the output line are summed up at the output line, and
wherein the bias current source is configured to provide a first bias current for either one of the first differential amplifier or the second differential amplifier individually outputting the current signal, and to provide a second bias current, having a larger amplitude than that of the first bias current, for both of the first and second differential amplifiers simultaneously outputting the current signals.

15. A method for operating a photoelectric conversion device, wherein the devise includes:
a photoelectric conversion unit;
a differential amplifier configured to output a current signal based on an amount of charges generated by the photoelectric conversion unit, wherein the differential amplifier includes a first input transistor and a second input transistor forming a differential pair;
a transfer transistor directly connected to an gate of the first input transistor, and configured to transfer a charge generated by the photoelectric conversion unit to the gate of the first input transistor;
a reset voltage providing unit configured to provide a reset voltage for the gate of the first input transistor and a gate of the second input transistor;
a reset transistor electrically connected to either one of the gate of the first input transistor or the gate of the second input transistor, and configured to control an electrical connection between the reset voltage providing unit and the gate connected to the reset transistor; and
a connection transistor configured to control an electrical connection between the gate of the first input transistor and the gate of the second input transistor, wherein a source of the connection transistor is directly connected to the gate of the first input transistor, and a drain of the connection transistor is directly connected to the gate of the second input transistor, and
wherein the method comprising:

turning on both of the reset transistor and the connection transistor;
thereafter, tuning off the reset transistor; and
thereafter, turning off the connection transistor.

* * * * *